(12) United States Patent
Brox et al.

(10) Patent No.: US 11,699,993 B2
(45) Date of Patent: Jul. 11, 2023

(54) SIGNAL SAMPLING WITH OFFSET CALIBRATION

(71) Applicant: Micron Technology, Inc., Boise, ID (US)

(72) Inventors: Martin Brox, Munich (DE); Thomas Hein, Munich (DE); Mani Balakrishnan, Munich (DE)

(73) Assignee: Micron Technology, Inc., Boise, ID (US)

( * ) Notice: Subject to any disclaimer, the term of this patent is extended or adjusted under 35 U.S.C. 154(b) by 82 days.

(21) Appl. No.: 17/395,069

(22) Filed: Aug. 5, 2021

(65) Prior Publication Data

US 2022/0085800 A1     Mar. 17, 2022

Related U.S. Application Data

(60) Provisional application No. 63/078,715, filed on Sep. 15, 2020.

(51) Int. Cl.
| | | |
|---|---|---|
| *G11C 17/16* | (2006.01) | |
| *H03K 5/24* | (2006.01) | |
| *G11C 17/18* | (2006.01) | |

(52) U.S. Cl.
CPC ............. *H03K 5/249* (2013.01); *G11C 17/16* (2013.01); *G11C 17/18* (2013.01)

(58) Field of Classification Search
CPC ........ H03K 5/249; G11C 17/16; G11C 17/18; G11C 7/1084; G11C 7/1093;

(Continued)

(56) References Cited

U.S. PATENT DOCUMENTS

| | | |
|---|---|---|
| 2008/0309375 A1 | 12/2008 | Schnarr |
| 2016/0125937 A1 | 5/2016 | Kang |

(Continued)

FOREIGN PATENT DOCUMENTS

KR   10-2016-0050534 A    5/2016

OTHER PUBLICATIONS

"International Search Report and Written Opinion of the International Searching Authority," issued in connection with Int'l Appl. No. PCT/US21/47527, dated Dec. 15, 2021 (10 pages).

*Primary Examiner* — Huan Hoang
*Assistant Examiner* — Minh Dinh
(74) *Attorney, Agent, or Firm* — Holland & Hart LLP

(57) ABSTRACT

Methods, systems, and devices for signal sampling with offset calibration are described. For example, sampling circuitry may include an input pair of transistors where input signals may be provided to gate nodes of the transistors, and an output signal may be generated based on a comparison of voltages of drain nodes of the transistors. In some examples, source nodes of the transistors may be coupled with each other, such as via a resistance, and each source node may be configured to be coupled with a ground node. In some examples, a conductive path between the source nodes may be coupled with one or more switching components configurable for further coupling of the source nodes with the ground node. In some examples, enabling such switching components may add an electrical characteristic (e.g., capacitance) to the conductive path between the source nodes, which may be configurable to mitigate sampling circuitry imbalances.

35 Claims, 7 Drawing Sheets

(58) Field of Classification Search
CPC ..... G11C 29/026; G11C 29/20; G11C 7/1087; G11C 27/02; G11C 29/022; G11C 29/028
USPC .......................................... 365/96
See application file for complete search history.

(56) References Cited

U.S. PATENT DOCUMENTS

| | | |
|---|---|---|
| 2017/0040983 A1 | 2/2017 | Chen et al. |
| 2017/0090503 A1* | 3/2017 | Pisasale .................... G05F 3/26 |
| 2017/0222602 A1* | 8/2017 | Savanth ................... H03K 4/50 |
| 2018/0102180 A1 | 4/2018 | Meacham |
| 2020/0091883 A1* | 3/2020 | Sharma ............... H03F 3/45174 |
| 2020/0230418 A1 | 7/2020 | Ahmadi |

* cited by examiner

SIGNAL SAMPLING WITH OFFSET CALIBRATION

CROSS REFERENCE

The present application for patent claims the benefit of U.S. Provisional Patent Application No. 63/078,715 by BROX et al., entitled "SIGNAL SAMPLING WITH OFFSET CALIBRATION," filed Sep. 15, 2020, which is assigned to the assignee hereof, and which is expressly incorporated by reference herein.

FIELD OF TECHNOLOGY

The following relates to digital signaling including signal sampling with offset calibration.

BACKGROUND

Memory devices are widely used to store information in various electronic devices such as computers, wireless communication devices, cameras, digital displays, and the like. Information is stored by programing memory cells within a memory device to various states. For example, binary memory cells may be programmed to one of two supported states, often denoted by a logic 1 or a logic 0. In some examples, a single memory cell may support more than two states, any one of which may be stored. To access the stored information, a component may read, or sense, at least one stored state in the memory device. To store information, a component may write, or program, the state in the memory device.

Various types of memory devices and memory cells exist, including magnetic hard disks, random access memory (RAM), read-only memory (ROM), dynamic RAM (DRAM), synchronous dynamic RAM (SDRAM), ferroelectric RAM (FeRAM), magnetic RAM (MRAM), resistive RAM (RRAM), flash memory, phase change memory (PCM), self-selecting memory, chalcogenide memory technologies, and others. Memory cells may be volatile or non-volatile. Non-volatile memory, e.g., FeRAM, may maintain their stored logic state for extended periods of time even in the absence of an external power source. Volatile memory devices, e.g., DRAM, may lose their stored state when disconnected from an external power source.

DETAILED DESCRIPTION

In some systems, sampling circuitry may be used at a device to receive or latch signaling from a signal transmitter. For example, in a memory system, communication may be supported over one or more channels between a host device and a memory device, and a receiving device (e.g., a memory device, a host device, both a memory device and a host device) may use sampling circuitry to receive or latch communication signaling over a channel. In some sampling architectures, differential or pseudo-differential signals may be provided to an input pair of transistors. The transistors of the input pair may have characteristics that are different than one another, which may be associated with an imbalance between the transistors of the input pair. In some cases, imbalances of sampling circuitry, such as an imbalance between transistors of an input pair, may be associated with limitations regarding signaling speed, signaling resolution, or signaling reliability or robustness, among others.

In accordance with examples as disclosed herein, sampling circuitry may be configured to mitigate imbalances, such as imbalances between transistors of an input pair or other components of sampling circuitry. For example, sampling circuitry may include an input pair of transistors where input signals are provided to gate nodes of the transistors, and an output signal may be generated based on a comparison of or between voltages of drain nodes of the transistors. In some examples, source nodes of the input pair of transistors may be coupled with each other via a resistance (e.g., a resistor, an intrinsic resistance of a conductive line), and at least one source node if not each source node may be configured to be coupled with a ground node (e.g., via a respective switching circuit, via a respective pull-down path), which may be referred to as a "split tail" configuration. In some examples, a conductive path between the source nodes of the input pair of transistors may be coupled with one or more additional switching components (e.g., on one or both sides of a resistance between the source nodes) configurable for further coupling of the source nodes with the ground node. In some examples, enabling such switching components may add an intrinsic capacitance or other electrical characteristic to the conductive path between the source nodes, which may be configurable to mitigate imbalances between the transistors of the input pair, among other advantages.

Figure 1:
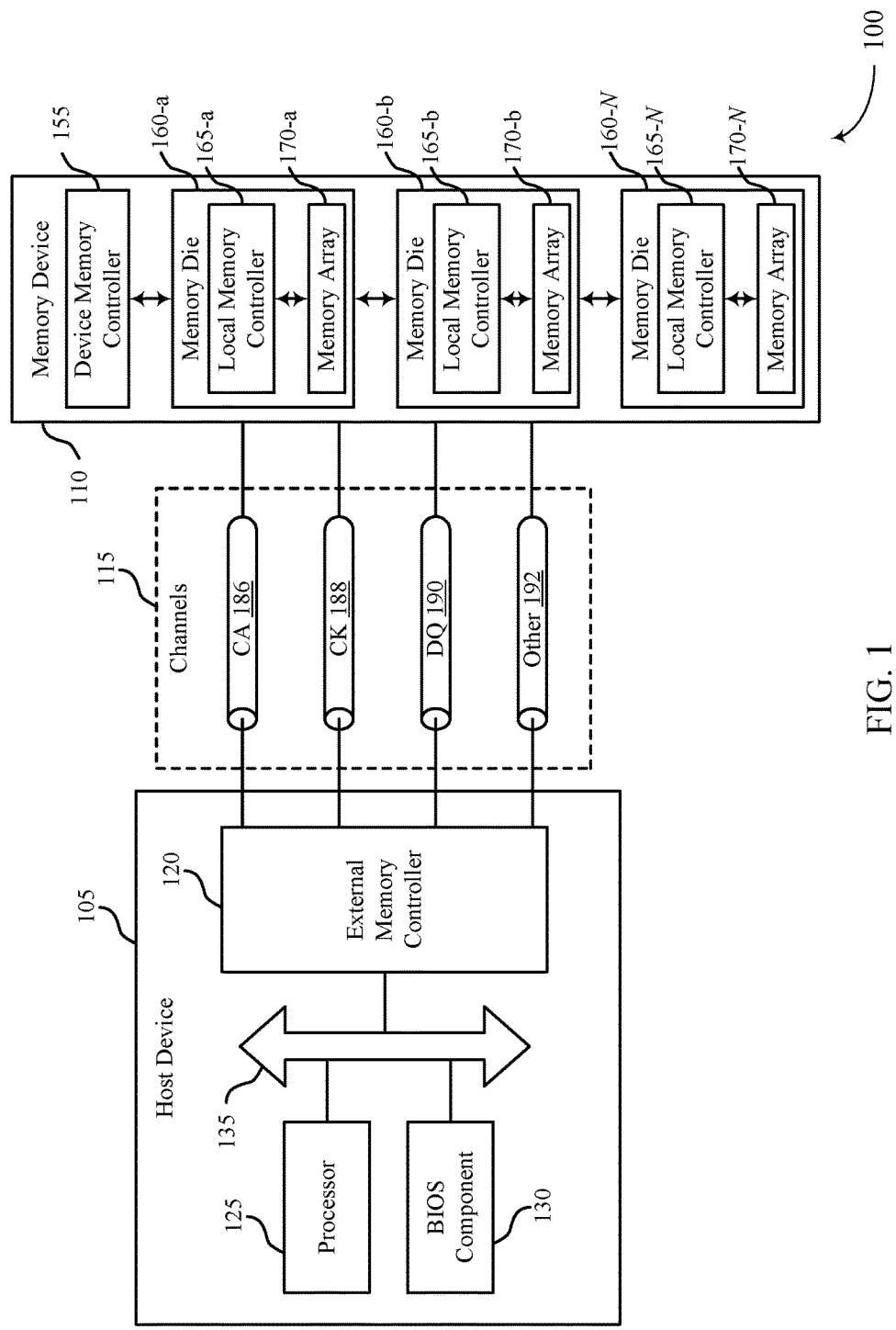
FIG. 1 illustrates an example of a system that supports signal sampling with offset calibration in accordance with examples as disclosed herein.

Features of the disclosure are initially described in the context of a system with reference to FIG. 1. Features of the disclosure are described in the context of sampling circuitry as described with reference to FIGS. 2-3. These and other features of the disclosure are further illustrated by and described with reference to an apparatus diagram and flowcharts that relate to signal sampling with offset calibration as described with reference to FIGS. 4-7.

FIG. 1 illustrates an example of a system 100 that supports signal sampling with offset calibration in accordance with examples as disclosed herein. The system 100 may include a host device 105, a memory device 110, and a plurality of channels 115 coupling the host device 105 with the memory device 110. The system 100 may include one or more memory devices 110, but aspects of the one or more memory devices 110 may be described in the context of a single memory device (e.g., memory device 110).

The system 100 may include portions of an electronic device, such as a computing device, a mobile computing device, a wireless device, a graphics processing device, a vehicle, or other systems. For example, the system 100 may illustrate aspects of a computer, a laptop computer, a tablet computer, a smartphone, a cellular phone, a wearable device, an internet-connected device, a vehicle controller, or the like. The memory device 110 may be a component of the system operable to store data for one or more other components of the system 100.

At least portions of the system 100 may be examples of the host device 105. The host device 105 may be an example of a processor or other circuitry within a device that uses memory to execute processes, such as within a computing device, a mobile computing device, a wireless device, a graphics processing device, a computer, a laptop computer, a tablet computer, a smartphone, a cellular phone, a wearable device, an internet-connected device, a vehicle controller, a system on a chip (SoC), or some other stationary or portable electronic device, among other examples. In some examples, the host device 105 may refer to the hardware, firmware, software, or a combination thereof that implements the functions of an external memory controller 120. In some examples, the external memory controller 120 may be referred to as a host or a host device 105.

A memory device 110 may be an independent device or a component that is operable to provide physical memory addresses/space that may be used or referenced by the system 100. In some examples, a memory device 110 may be configurable to work with one or more different types of host devices. Signaling between the host device 105 and the memory device 110 may be operable to support one or more of: modulation schemes to modulate the signals, various pin configurations for communicating the signals, various form factors for physical packaging of the host device 105 and the memory device 110, clock signaling and synchronization between the host device 105 and the memory device 110, timing conventions, or other factors.

The memory device 110 may be operable to store data for the components of the host device 105. In some examples, the memory device 110 may act as a slave-type device to the host device 105 (e.g., responding to and executing commands provided by the host device 105 through the external memory controller 120). Such commands may include one or more of a write command for a write operation, a read command for a read operation, a refresh command for a refresh operation, or other commands.

The host device 105 may include one or more of an external memory controller 120, a processor 125, a basic input/output system (BIOS) component 130, or other components such as one or more peripheral components or one or more input/output controllers. The components of host device 105 may be coupled with one another using a bus 135.

The processor 125 may be operable to provide control or other functionality for at least portions of the system 100 or at least portions of the host device 105. The processor 125 may be a general-purpose processor, a digital signal processor (DSP), an application-specific integrated circuit (ASIC), a field-programmable gate array (FPGA) or other programmable logic device, discrete gate or transistor logic, discrete hardware components, or a combination of these components. In such examples, the processor 125 may be an example of a central processing unit (CPU), a graphics processing unit (GPU), a general purpose GPU (GPGPU), or an SoC, among other examples. In some examples, the external memory controller 120 may be implemented by or be a part of the processor 125.

The BIOS component 130 may be a software component that includes a BIOS operated as firmware, which may initialize and run various hardware components of the system 100 or the host device 105. The BIOS component 130 may also manage data flow between the processor 125 and the various components of the system 100 or the host device 105. The BIOS component 130 may include a program or software stored in one or more of read-only memory (ROM), flash memory, or other non-volatile memory.

The memory device 110 may include a device memory controller 155 and one or more memory dies 160 (e.g., memory chips) to support a desired capacity or a specified capacity for data storage. Each memory die 160 may include a local memory controller 165 (e.g., local memory controller 165-a, local memory controller 165-b, local memory controller 165-N) and a memory array 170 (e.g., memory array 170-a, memory array 170-b, memory array 170-N). A memory array 170 may be a collection (e.g., one or more grids, one or more banks, one or more tiles, one or more sections) of memory cells, with each memory cell being operable to store at least one bit of data. A memory device 110 including two or more memory dies may be referred to as a multi-die memory or a multi-die package or a multi-chip memory or a multi-chip package.

The device memory controller 155 may include circuits, logic, or components operable to control operation of the memory device 110. The device memory controller 155 may include the hardware, the firmware, or the instructions that enable the memory device 110 to perform various operations and may be operable to receive, transmit, or execute commands, data, or control information related to the components of the memory device 110. The device memory controller 155 may be operable to communicate with one or more of the external memory controller 120, the one or more memory dies 160, or the processor 125. In some examples, the device memory controller 155 may control operation of the memory device 110 described herein in conjunction with the local memory controller 165 of the memory die 160.

In some examples, the memory device 110 may receive data or commands or both from the host device 105. For example, the memory device 110 may receive a write command indicating that the memory device 110 is to store data for the host device 105 or a read command indicating that the memory device 110 is to provide data stored in a memory die 160 to the host device 105.

A local memory controller 165 (e.g., local to a memory die 160) may include circuits, logic, or components operable to control operation of the memory die 160. In some examples, a local memory controller 165 may be operable to communicate (e.g., receive or transmit data or commands or both) with the device memory controller 155. In some examples, a memory device 110 may not include a device memory controller 155, and a local memory controller 165, or the external memory controller 120 may perform various functions described herein. As such, a local memory controller 165 may be operable to communicate with the device memory controller 155, with other local memory controllers 165, or directly with the external memory controller 120, or the processor 125, or a combination thereof. Examples of components that may be included in the device memory controller 155 or the local memory controllers 165 or both may include receivers for receiving signals (e.g., from the external memory controller 120), transmitters for transmitting signals (e.g., to the external memory controller 120), decoders for decoding or demodulating received signals, encoders for encoding or modulating signals to be transmitted, or various other circuits or controllers (e.g., sampling circuitry) operable for supporting described operations of the device memory controller 155 or local memory controller 165 or both.

The external memory controller 120 may be operable to enable communication of one or more of information, data, or commands between components of the system 100 or the host device 105 (e.g., the processor 125) and the memory device 110. The external memory controller 120 may convert or translate communications exchanged between the components of the host device 105 and the memory device 110. In some examples, the external memory controller 120 or other component of the system 100 or the host device 105, or its functions described herein, may be implemented by the processor 125. For example, the external memory controller 120 may be hardware, firmware, or software, or some combination thereof implemented by the processor 125 or other component of the system 100 or the host device 105. Although the external memory controller 120 is depicted as being external to the memory device 110, in some examples, the external memory controller 120, or its functions described herein, may be implemented by one or more components of a memory device 110 (e.g., a device memory controller 155, a local memory controller 165) or vice versa.

The components of the host device 105 may exchange information with the memory device 110 using one or more channels 115. The channels 115 may be operable to support communications between the external memory controller 120 and the memory device 110. Each channel 115 may be an example of a transmission medium that carries information between the host device 105 and the memory device. Each channel 115 may include one or more signal paths or transmission mediums (e.g., conductors) between terminals associated with the components of system 100. A signal path may be an example of a conductive path operable to carry a signal. For example, a channel 115 may include a first terminal including one or more pins or pads at the host device 105 and one or more pins or pads at the memory device 110. A pin may be an example of a conductive input or output point of a device of the system 100, and a pin may be operable to act as part of a channel.

Channels 115 (and associated signal paths and terminals) may be dedicated to communicating one or more types of information. For example, the channels 115 may include one or more command and address (CA) channels 186, one or more clock signal (CK) channels 188, one or more data (DQ) channels 190, one or more other channels 192, or a combination thereof. In some examples, signaling may be communicated over the channels 115 using single data rate (SDR) signaling or double data rate (DDR) signaling. In SDR signaling, one modulation symbol (e.g., signal level) of a signal may be registered for each clock cycle (e.g., on a rising or falling edge of a clock signal). In DDR signaling, two modulation symbols (e.g., signal levels) of a signal may be registered for each clock cycle (e.g., on both a rising edge and a falling edge of a clock signal). In some examples, symbol registration may be provided by or supported by various examples of sampling circuitry.

In some examples, CA channels 186 may be operable to communicate commands between the host device 105 and the memory device 110 including control information associated with the commands (e.g., address information). For example, commands carried by the CA channel 186 may include a read command with an address of the desired data. In some examples, a CA channel 186 may include any quantity of signal paths to decode one or more of address or command data (e.g., eight or nine signal paths).

In some examples, clock signal channels 188 may be operable to communicate one or more clock signals between the host device 105 and the memory device 110. Each clock signal may be operable to oscillate between a high state and a low state, and may support coordination (e.g., in time) between actions of the host device 105 and the memory device 110. In some examples, the clock signal may be single ended. In some examples, the clock signal may provide a timing reference for command and addressing operations for the memory device 110, or other system-wide operations for the memory device 110. A clock signal therefore may be referred to as a control clock signal, a command clock signal, or a system clock signal. A system clock signal may be generated by a system clock, which may include one or more hardware components (e.g., oscillators, crystals, logic gates, transistors).

In some examples, data channels 190 may be operable to communicate one or more of data or control information between the host device 105 and the memory device 110. For example, the data channels 190 may communicate information (e.g., bi-directional) to be written to the memory device 110 (e.g., and received via sampling circuitry of the memory device 110) or information read from the memory device 110 (e.g., and received via sampling circuitry of the host device 105).

The channels 115 may include any quantity of signal paths, including a single signal path. In some examples, a channel 115 may include multiple individual signal paths. For example, a channel may be x4 (e.g., including four signal paths), x8 (e.g., including eight signal paths), x16 (e.g., including sixteen signal paths), etc.

In some examples, the one or more other channels 192 may include one or more error detection code (EDC) channels. The EDC channels may be operable to communicate error detection signals, such as checksums, to improve system reliability. An EDC channel may include any quantity of signal paths.

Signals communicated over the channels 115 may be modulated using one or more different modulation schemes. In some examples, a binary-symbol or binary-level modulation scheme may be used to modulate signals communicated between the host device 105 and the memory device 110. A binary-symbol modulation scheme may be an example of a M-ary modulation scheme where M is equal to two. Each symbol of a binary-symbol modulation scheme may be operable to represent one bit of digital data (e.g., a symbol may represent a logic 1 or a logic 0). Examples of binary-symbol modulation schemes include, but are not limited to, non-return-to-zero (NRZ), unipolar encoding, bipolar encoding, Manchester encoding, pulse amplitude modulation (PAM) having two symbols (e.g., PAM2), and/or others.

In some examples, a multi-symbol or multi-level modulation scheme may be used to modulate signals communicated between the host device 105 and the memory device 110. A multi-symbol modulation scheme may be an example of a M-ary modulation scheme where M is greater than or equal to three. Each symbol of a multi-symbol modulation scheme may be operable to represent more than one bit of digital data (e.g., a symbol may represent a logic 00, a logic 01, a logic 10, or a logic 11). Examples of multi-symbol modulation schemes include, but are not limited to, PAM3, PAM4, PAM8, etc., quadrature amplitude modulation (QAM), quadrature phase shift keying (QPSK), and/or others. A multi-symbol signal (e.g., a PAM3 signal or a PAM4 signal) may be a signal that is modulated using a modulation scheme that includes at least three levels to encode more than one bit of information. Multi-symbol modulation schemes and symbols may alternatively be referred to as non-binary, multi-bit, or higher-order modulation schemes and symbols.

In some systems, sampling circuitry may be used at device to receive or latch signaling from a transmitting device or component. For example, in the system 100, communication over channels 115 may involve sampling circuitry of a memory device 110, or sampling circuitry of a host device 105, or both to receive or latch communication signaling over the channels 115. Although some examples of sampled communication are described in the context of channels 115, other communications between components of the system 100 may be supported by various implementations of sampling circuitry in accordance with examples as disclosed herein (e.g., sampling circuitry of a host device 105, of an external memory controller 120, of a processor 125, of a BIOS component 130, of a memory device 110, of a device memory controller 155, of a memory die 160, or of a local memory controller 165, or various combinations thereof). Moreover, although some examples are described in the context of sampled communication in memory systems, sampling circuitry in accordance with examples described herein may be applied to other systems or signaling architectures (e.g., other digital signaling architectures).

In some sampling techniques, differential or pseudo-differential signals may be provided to an input pair of transistors. Although transistors of an input pair may be designed with the same, similar, or symmetric characteristics, in some examples, transistors of an input pair may have characteristics that are different than one another, including characteristics that vary as a result of processing or fabrication variations (e.g., doping variations, thin film deposition or subtraction variations), characteristics that vary as a result of operating conditions (e.g., operating voltages, operating temperatures, operating durations or time-in-service), or other distributions. For example, a first transistor of an input pair may have a threshold characteristic (e.g., a threshold voltage difference between a gate node and a source node for enabling conductivity between a drain node and the source node), a charge or carrier mobility characteristic, a saturation characteristic, a resistance characteristic, a capacitance characteristic, a parasitic characteristic, a sub-threshold or linearity characteristic, a drain-induced barrier lowering characteristic, or any other characteristic, or any combination of characteristics that is different than a corresponding characteristic or any combination of characteristics of a second transistor of the input pair. In some examples, differences of characteristics between transistors of an input pair, or of other pairs or groups of transistors that are designed to be symmetric or otherwise share common operating characteristics, may be associated with limitations regarding signaling speed, signaling resolution, or signaling reliability or robustness, among other options.

In accordance with examples as disclosed herein, sampling circuitry may be configured or configurable to mitigate imbalances, such as imbalances between transistors of an input pair or other components of sampling circuitry that are designed or configured to be balanced (e.g., having common or symmetric design characteristics). For example, sampling circuitry may include an input pair of transistors, where input signals may be provided to gate nodes of the transistors and an output signal may be generated based on a comparison of or between voltages of drain nodes of the transistors. In some examples, source nodes of the input pair of transistors may be coupled with each other via a resistance (e.g., a resistor, an intrinsic resistance of a conductive line), and at least one source node if not each source node may be configured to be coupled with a ground node (e.g., via a respective switching circuit, via a respective pull-down path), which may be referred to as a "split tail" configuration. In some examples, a conductive path between the source nodes of the input pair of transistors may be coupled with one or more additional switching components (e.g., on one or both sides of a resistance between the source nodes) configurable for further coupling of the source nodes with the ground node. In some examples, enabling such switching components may add or couple an intrinsic capacitance or other electrical characteristic (e.g., of or otherwise enabled by the one or more additional switching components) to the conductive path between the source nodes, which may be configurable to mitigate imbalances between the transistors of the input pair, among other advantages.

Figure 2:
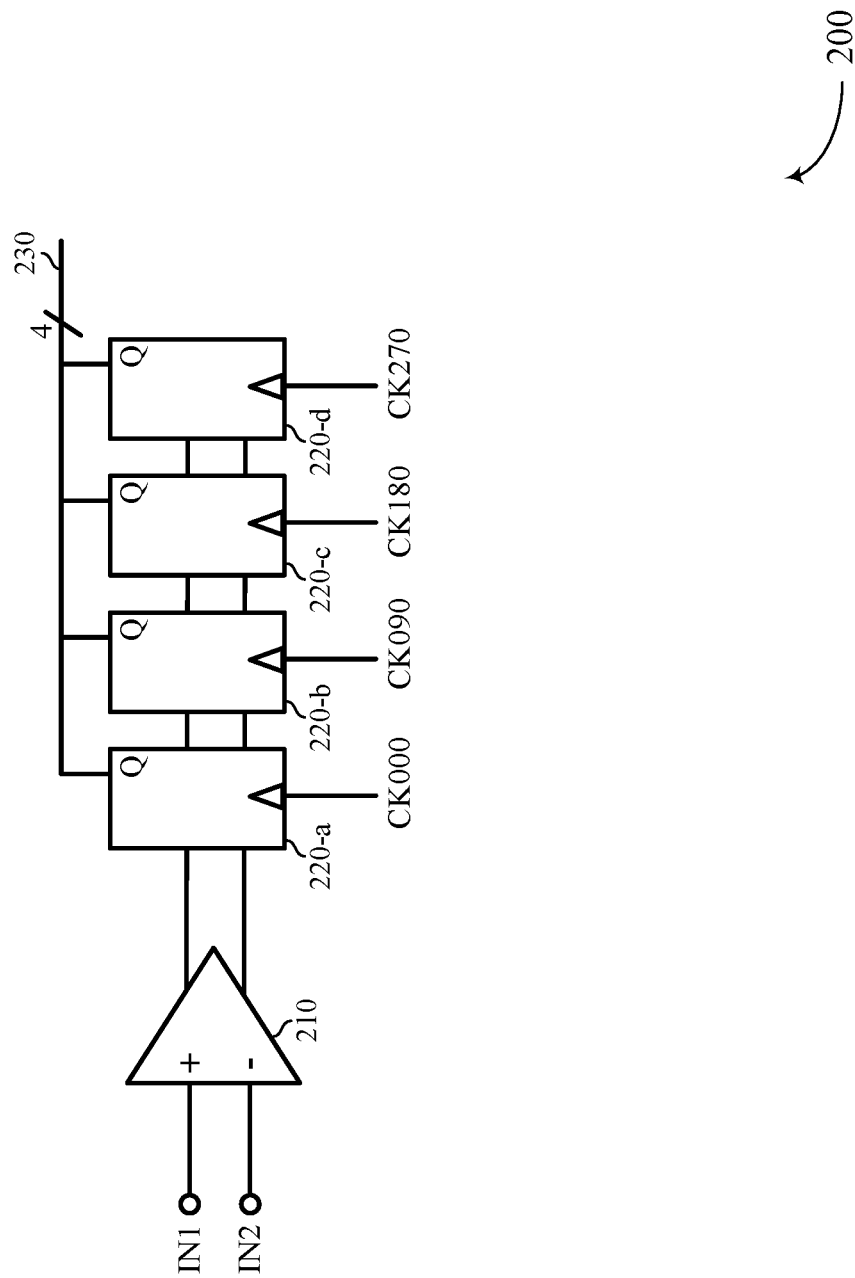
FIG. 2 illustrates an example of circuitry that supports signal sampling with offset calibration in accordance with examples as disclosed herein.

FIG. 2 illustrates an example of circuitry 200 that supports signal sampling with offset calibration in accordance with examples as disclosed herein. In some examples, the circuitry 200 may be an example of circuitry configured to receive or latch signaling at a host device 105 (e.g., at an external memory controller 120), or at a memory device 110 (e.g., at a device memory controller 155, at a local memory controller), as described with reference to FIG. 1. The circuitry 200 may illustrate an example of a receiver topology that supports relatively high speed or high rate communication signaling (e.g., digital signaling).

The circuitry 200 may be configured for sampling differential signaling, which may be related to a voltage difference between a first input signal, IN1 (e.g., a "positive" input signal), and a second input signal, IN2 (e.g., a "negative" input signal, a reference input signal). In some examples, the first input signal may be a data signal (e.g., a DQ signal), or a command and address signal (e.g., a CA signal), or another signal that may be communicated over a channel 115 as described with reference to FIG. 1 (e.g., via an bus or interface that is external to the circuitry 200 or external to a device that includes the circuitry 200). The second input signal may be a reference signal (e.g., a "VREFD" signal) having a voltage from which the first input signal is compared or that may be otherwise used to generate a sampled signal. In some examples (e.g., in a fully differential configuration, in a double-ended configuration), the second input signal may be communicated over a channel 115, or otherwise communicated or conveyed via a communicative coupling (e.g., between a host device 105 and a memory device 110, concurrently with or in parallel with communicating the first input signal). In some examples (e.g., in a pseudo-differential configuration, in a single-ended configuration), the second input signal may be generated by a receiving device (e.g., not directly or explicitly communicated by a transmitting device). For example, when the circuitry 200 is included in a memory device 110, the first input signal may be received from a host device 105, and the second input signal may be generated at the memory device 110. In some examples, the second input signal may be a ground voltage, or may be based at least in part on a ground voltage, which may or may not be common between a signal transmitter and a signal receiver in various examples.

The first and second input signals may be received at an amplifier 210 (e.g., a preamplifier) to amplify the input signals for driving one or more samplers 220 (e.g., samplers 220-*a* through 220-*d*) according to various rates or deserialization techniques. In the example of circuitry 200, communication signaling may be sampled by four samplers 220 according to a four-phase clock distribution (e.g., according to clock signals CK000, CK090, CK180, and CK270, separated by 90 degrees of timing or phase angle). Sampler 220-*a* may be configured to latch an output signal on an output bus 230 (e.g., a four-signal bus) based on a transition of the clock signal CK000 (e.g., a rising edge of the clock signal CK000, a falling edge of the clock signal CK000), sampler 220-*b* may be configured to latch an output signal on the output bus 230 based on a transition of the clock signal CK090, and so on. Although a single string of samplers 220 are illustrated in the example of circuitry 200, which may be implemented to support a binary modulation scheme, in other examples in accordance with examples as disclosed herein, sampling circuitry may implement multiple strings or stacks of samplers 220, which may be implemented to support multi-symbol modulation schemes such as PAM3, PAM4, PAM8, QAM, QPSK, and other modulation schemes.

The components of the circuitry 200 may be designed according to various characteristics for a given communication rate, serialization technique, or modulation scheme, or various combinations thereof. For example, to support relatively high-speed sampling, the samplers 220 may be designed with relatively small input capacitance, which may limit an amount of charge transfer involved in driving or transitioning an input voltage at the sampler 220, or limit an apparent load on the amplifier 210. In some examples, such a design may involve an input pair of transistors (e.g., of a sampler 220) with a relatively small footprint or area, or otherwise including relatively small features. Relatively small transistors, which may be associated with relatively low capacitance, may also be relatively sensitive to variations such as production variations, operating variations, aging variations, or other variations, which may increase a probability or magnitude of imbalance between the input pair. In some examples, an imbalance of an input pair of transistors, or other components of a sampler 220, may be associated with limitations regarding signaling speed, signaling resolution, or signaling reliability or robustness (e.g., a data eye), among other limitations. In accordance with examples as disclosed herein, samplers 220 may be configured or configurable to mitigate effects of such imbalances, among other advantages.

Figure 3:
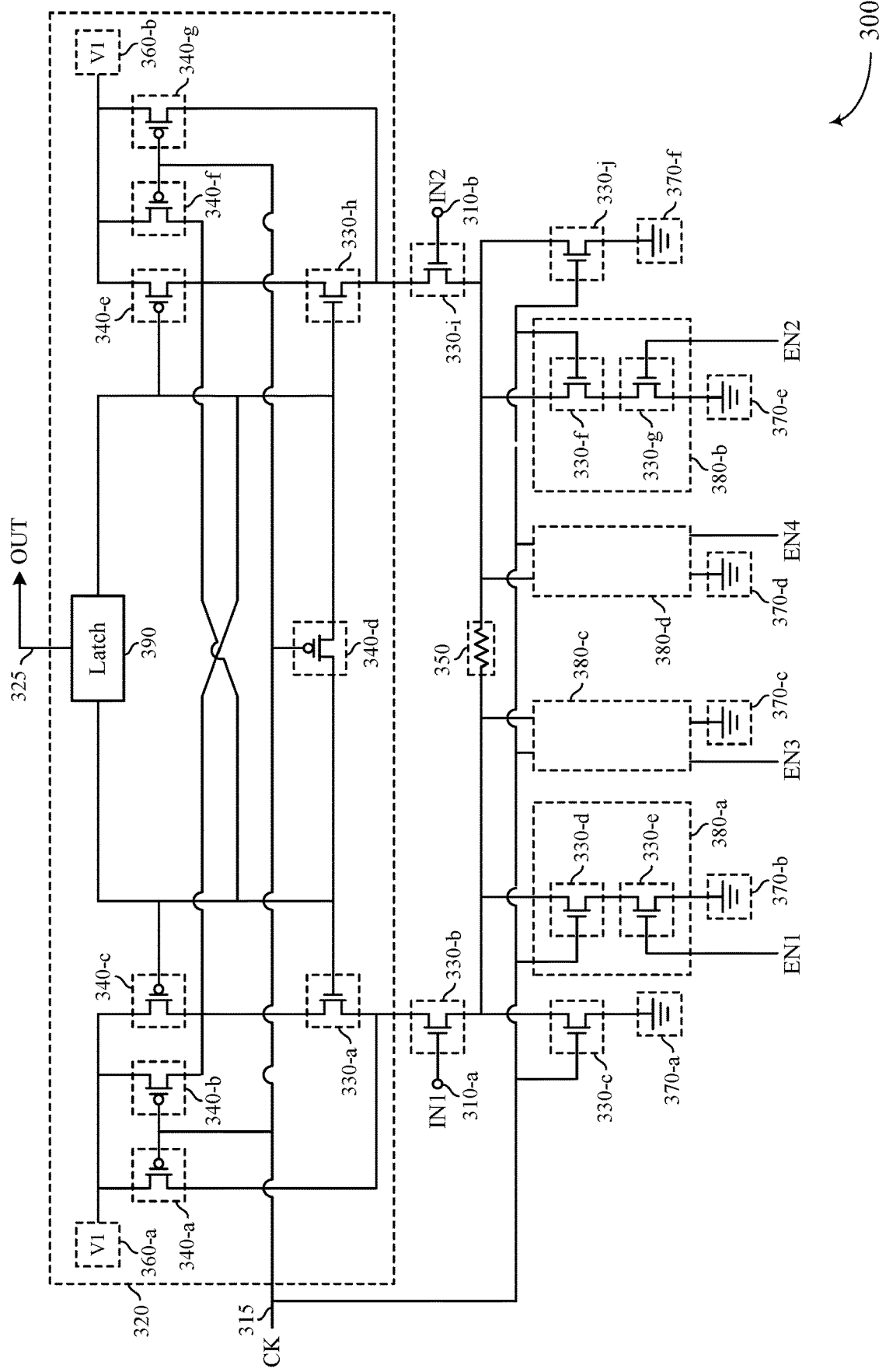
FIG. 3 illustrates an example of sampling circuitry that supports signal sampling with offset calibration in accordance with examples as disclosed herein.

FIG. 3 illustrates an example of sampling circuitry 300 that supports signal sampling with offset calibration in accordance with examples as disclosed herein. The sampling circuitry 300 may be an example of or be otherwise included in a sampler 220 described with reference to FIG. 2. In various examples, the sampling circuitry may be included in a memory device 110, in a host device 105, or in another type of device (or any combination thereof) that receives or samples communication signaling such as digital communication signaling.

The sampling circuitry 300 includes a first input node 310-*a* (e.g., a positive input node) configured to receive a first input signal, IN1, and a second input node 310-*b* (e.g., a negative input node, a reference input node) configured to receive a second input signal, IN2. The sampling circuitry 300 also includes output circuitry 320 configured to generate an output signal, OUT, at an output bus 325, based on the first input signal and the second input signal. The sampling circuitry 300 may include various voltage sources to support the described techniques, including positive voltage sources 360 and ground voltage sources 370. Although various voltage sources may be illustrated as separate sources, in some examples, such voltage sources may biased with a same voltage source or supply, or may be otherwise equivalent (e.g., positive voltage sources 360-*a* and 360-*b* may be electrically equivalent or associated with a same voltage level, ground voltage sources 370-*a* through 370-*f* may be electrically equivalent or associated with a same voltage level).

The sampling circuitry 300 may include various configurations of components, such as n-type transistors 330 and p-type transistors 340. In the illustrated example, the n-type transistors 330-*b* and 330-*i* may form an input pair of transistors, where the first input node 310-*a* is coupled with a gate (e.g., a gate node) of the n-type transistor 330-*b* and the second input node 310-*b* is coupled with a gate of the n-type transistor 330-*i*. The output circuitry 320 may be coupled with a drain (e.g., a drain node) of the n-type transistor 330-*b* and a drain of the n-type transistor 330-*i*, and may be configured to generate the output signal based on a voltage of the first input node 310-*a* and a voltage of the second input node 310-*b* (e.g., based on a drain voltage of the n-type transistor 330-*b* and a drain voltage of the n-type transistor 330-*i*, or comparison thereof, or based on a source voltage of the n-type transistor 330-*b* and a source voltage of the n-type transistor 330-*i*, or based on a combination thereof).

In some sampling architectures that apply differential signaling to gates of an input pair of transistors, source nodes of the input pair of transistors may be coupled or connected with each other, or may be coupled or connected with a common ground node, or both (e.g., in a "common tail" configuration). In some cases, however, such a configuration may be relatively sensitive to differences in characteristics of the transistors of the input pair, such as differences in threshold voltages of the transistors. For example, such differences may be associated with offsets or imbalances that limit the speed or robustness of the corresponding sampling architecture. In accordance with examples as disclosed herein, the sampling circuitry 300 may be configured (e.g., with an offset or imbalance cancelation or mitigation capability) to mitigate such offsets or imbalances, including those related to differences in characteristics that may be present between the n-type transistor 330-*b* and the n-type transistor 330-*i*.

In some examples of a configuration that supports imbalance mitigation, the sampling circuitry 300 may be configured with a "split tail" configuration. For example, as illustrated, a source (e.g., source node) of the n-type transistor 330-*b* may be coupled with a source of the n-type transistor 330-*i* via a resistor 350. Although the resistor 350 is illustrated as a component between the n-type transistor 330-*b* and the n-type transistor 330-*i*, the resistor 350 may be illustrative of or otherwise supported by a distributed characteristic, such as an intrinsic resistance of a conductive line between the n-type transistor 330-*b* and the n-type transistor 330-*i*. As a result of the resistor 350, in the example of sampling circuitry 300, the source of the n-type transistor 330-*b* (e.g., a first tail node) and the source of the n-type transistor 330-*i* (e.g., a second tail node, a complement tail node) may not be electrically equivalent. Rather, a current flow across the resistor 350 may be associated with a voltage difference or separation between the source of the n-type transistor 330-*b* and the source of the n-type transistor 330-*i*, which may be leveraged to compensate for threshold voltage differences between the n-type transistor 330-*b* and the n-type transistor 330-*i*. Although various examples of sampling circuitry 300 may include various quantities of resistors between the n-type transistors 330-*b* and 330-*i*, and various magnitudes of resistance, in some examples, sampling circuitry 300 may advantageously employ a single resistor 350 having a resistance that is relatively small.

In the split tail configuration of sampling circuitry 300, the source nodes of the n-type transistor 330-*b* and the n-type transistor 330-*i* may be separately or individually configured for coupling with a voltage source (e.g., a ground node), such as a dynamic coupling based on a clock signal, CK. For example, the n-type transistor 330-c may be an example of a switching circuit configurable to couple the source of the n-type transistor 330-b with a voltage source (e.g., ground voltage source 370-a) based on the clock signal applied to the gate of the n-type transistor 330-c. Further, the n-type transistor 330-j may be an example of a switching circuit configurable to couple the source of the n-type transistor 330-i with a voltage source (e.g., ground voltage source 370-f) based on the clock signal applied to the gate of the n-type transistor 330-j. Accordingly, the n-type transistor 330-c and the n-type transistor 330-j may support respective and independent pull-down paths for the n-type transistor 330-b and the n-type transistor 330-i.

In some examples of a configuration that may support imbalance mitigation, the sampling circuitry 300 may additionally or alternatively include switching circuits 380, which may be configurable to couple the source of the n-type transistor 330-b with a voltage source (e.g., a ground voltage source 370) or to couple the source of the n-type transistor 330-b with a voltage source. In various examples, such coupling may be based on an enable signal, a clock signal, or a combination thereof.

For example, the sampling circuitry 300 may include a switching circuit 380-a configurable to couple the source of the n-type transistor 330-b with the ground voltage source 370-b based on the clock signal, CK, and an enable signal, EN1. The example of switching circuit 380-a may include an n-type transistor 330-d and an n-type transistor 330-e in an electrically serial configuration (e.g., a serial coupling, a serial connection) between the source node of the n-type transistor 330-b and the ground voltage source 370-b, where the n-type transistor 330-d may be configurable to be enabled (e.g., configured to support a conductive state) based on the clock signal, CK, and the n-type transistor 330-e may be configurable to be enabled based on the enable signal, EN1. Although illustrated in a particular relative order in the electrically serial configuration, the relative order of the n-type transistors 330-d and 330-e may be swapped such that, in some examples, an n-type transistor 330 of the switching circuit 380-a that is enabled by the enable signal, EN1, may be relatively closer (e.g., electrically) to the n-type transistor 330-b and an n-type transistor 330 of the switching circuit 380-a that is enabled by the clock signal, CK, may be relatively closer to the ground voltage source 370-b.

Additionally or alternatively, the sampling circuitry 300 may include a switching circuit 380-b configurable to couple the source of the n-type transistor 330-i with the ground voltage source 370-e based on the clock signal, CK, and an enable signal, EN2. The example of switching circuit 380-b may include an n-type transistor 330-f and an n-type transistor 330-g in an electrically serial configuration between the source node of the n-type transistor 330-i and the ground voltage source 370-e, where the n-type transistor 330-f may be configurable to be enabled based at least in part on the clock signal, CK, and the n-type transistor 330-g may be configurable to be enabled based at least in part on the enable signal, EN2. Although illustrated in a particular relative order in the electrically serial configuration, the relative order of the n-type transistors 330-f and 330-g may be swapped such that, in some examples, an n-type transistor 330 of the switching circuit 380-b that is enabled by the enable signal, EN2, may be relatively closer to the n-type transistor 330-i and an n-type transistor 330 of the switching circuit 380-b that is enabled by the clock signal, CK, may be relatively closer to the ground voltage source 370-e.

The switching circuits 380 may be examples of digitally-programmable imbalance cancelation circuits, which may be dynamically enabled or disabled based on various configurations or evaluations of the sampling circuitry 300. For example, enable signals such as EN1 and EN2 may be generated based on evaluating the sampling circuitry 300 for imbalances that may be related to a difference in threshold voltages between the n-type transistors 330-b and 330-i, or other imbalances of the sampling circuitry 300. In one direction of imbalance, for example, the enable signal EN1 may be activated and the enable signal EN2 may be deactivated, and in another direction of imbalance, the enable signal EN1 may be deactivated and the enable signal EN2 may be activated. In some examples, such evaluations may be performed as part of a manufacturing or validation operation, or an installation or assembly operation, and related configuration information may be stored in a register of an associated device or component (e.g., set or written in a register circuit, or a one-time programmable storage element such as a fuse or an anti-fuse). In some examples, such evaluations may be performed as part of a power-up evaluation, an initialization evaluation, or a periodic evaluation (e.g., of a training sequence by a sequencer of an associated device or component), and related configuration information may be stored in a dynamic register or storage component of an associated device or component. In these and other examples, the sampling circuitry 300 or an associated device or component may include circuitry configured to generate the enable signals based on a stored configuration setting.

In some examples, enabling the switching circuits 380 may add an intrinsic capacitance or other electrical characteristic to the conductive path between the source nodes of the n-type transistors 330-b and 330-i. For example, regarding the switching circuit 380-a, one or both of the n-type transistor 330-d or the n-type transistor 330-e may be associated with an intrinsic capacitance (e.g., a capacitance related to a base-to-emitter junction, a capacitance related to a base-to-collector junction), which may be referred to as a parasitic or stray capacitance. In the example of sampling circuitry 300, however, such capacitance of or enabled by a switching circuit 380 may be favorably leveraged to alleviate adverse effects of imbalance, such as imbalance between threshold voltages of the n-type transistors 330-b and 330-i. For example, an intrinsic capacitance may be coupled at a location between the source of the n-type transistor 330-b and the resistor 350, or at a location between the source of the n-type transistor 330-i and the resistor 350, or both, which may be configurable to mitigate an imbalance of the sampling circuitry 300. In some examples, such an configurable capacitance may be selected to support an impedance associated with a desired charge or current flow across the resistor 350, which may be associated with driving a voltage difference between the source of the n-type transistor 330-b and the source of the n-type transistor 330-i. In some examples, such a voltage difference (e.g., of a split tail configuration) may compensate for differences between threshold voltages of the n-type transistors 330-b and 330-i.

In various examples, the sampling circuitry 300 may include any quantity of one or more switching circuits 380, which may support configuring different magnitudes or resolutions of imbalance compensation. For example, the sampling circuitry 300 may include a switching circuit 380-c configurable to couple the source of the n-type transistor 330-b with the ground voltage source 370-c based on the clock signal, CK, and an enable signal, EN3, and a switching circuit 380-d configurable to couple the source of the n-type transistor 330-i with the ground voltage source 370-d based on the clock signal, CK, and an enable signal, EN4. In some examples, switching circuits 380 may include similar configurations of transistors, or may have different configurations of transistors. For example, the n-type transistor 330-*e* of the switching circuit 380-*a* may be larger or smaller than a corresponding n-type transistor of the switching circuit 380-*c* (e.g., as enabled by the enable signal, EN4), which may support the dynamic enabling or disabling of transistors associated with different levels of intrinsic capacitance. In some examples, the n-type transistors of switching circuits 380 may be smaller than the n-type transistors 330-*c* and 330-*j*, which may be referred to as "main" tail transistors. In an example of sampling circuitry 300 that includes four switching circuits 380, the sampling circuitry 300 may be configured with one of sixteen options (e.g., unique combinations of enabled switching circuits 380) for configurable capacitance or other imbalance cancelation, but sampling circuitry 300 may be configured with other quantities of options for configurable capacitance to support other ranges or resolutions of imbalance compensation. In various examples, each of the combinations of switching circuits 380 may be enabled in an iterative manner (e.g., in a training sequence, in a manufacturing or validation operation), which may be used to evaluate the available options for imbalance mitigation provided by the switching circuits 380. A combination of enabled switching circuits 380 that provides a desirable or favorable imbalance mitigation may thus be identified, and related information may be written and accessed for generating the described enable signals.

The sampling of signals provided to the input nodes 310-*a* and 310-*b* may be provided by the sampling circuitry 300 based at least in part on the clock signal, CK, which may be provided to the gates of various n-type transistors 330 and p-type transistors 340 including the configuration as illustrated in sampling circuitry 300. For example, upon or based on a rising edge of the clock signal (e.g., when the clock signal is high), the n-type transistors 330-*c*, 330-*d*, 330-*f*, and 330-*g* may each be enabled (e.g., in a conductive state), whereas the p-type transistors 340-*a*, 340-*b*, 340-*d*, 340-*f*, and 340-*g* may be disabled (e.g., in a non-conductive state). Accordingly, the source nodes of the n-type transistors 330-*b* and 330-*i* may be coupled with one or more ground voltage sources 370 (e.g., including a coupling via enabled switching circuits 380), and the gate nodes of the n-type transistors 330-*a* and 330-*h* and the gate nodes of the p-type transistors 340-*c* and 340-*e* may be isolated from the positive voltage sources 360-*a* and 360-*b*. Upon or based on a falling edge of the clock signal (e.g., when the clock signal is low), the n-type transistors 330-*c*, 330-*d*, 330-*f*, and 330-*g* may each be disabled, whereas the p-type transistors 340-*a*, 340-*b*, 340-*d*, 340-*f*, and 340-*g* may be enabled. Accordingly, the source nodes of the n-type transistors 330-*b* and 330-*i* may be isolated from one or more ground voltage sources 370, and the gate nodes of the n-type transistors 330-*a* and 330-*h* and the gate nodes of the p-type transistors 340-*c* and 340-*e* may be coupled with the positive voltage sources 360-*a* and 360-*b*. In some examples, such a condition may support a comparison between a voltage of the input node 310-*a* and a voltage of the input node 310-*b* (e.g., a comparison between a drain of the n-type transistor 330-*b* and a drain of the n-type transistor 330-*i*, based on the cross-coupling of the n-type transistors 330-*a* and 330-*h* and the p-type transistors 340-*c* and 340-*e*). In some examples, such a comparison may include a compensation of an imbalance between threshold voltages of the n-type transistors 330-*b* and 330-*i*, such as voltage difference related to current flow across the resistor 350. A result of such a comparison may be provided to the latch 390 (e.g., a set-reset (SR) latch, a reset-set (RS) latch, or other bistable circuitry or flip-flop), which may be configured to latch an output signal on the output bus 325. In various examples, such a latching may be triggered based on a clock signal, such as the clock signal, CK (e.g., when the clock signal, CK, is also provided to the latch 390), or based on a clock signal that has a same frequency as the clock signal, CK, but with a different timing or phasing.

Although the sampling circuitry 300 illustrates certain examples of output circuitry 320 and switching circuits (e.g., n-type transistors 330, p-type transistors 340, switching circuits of a split tail, switching circuits 380), among other components, sampling circuitry in accordance with examples as disclosed herein may include output circuitry or switching circuits having different quantities of circuit elements, different types of circuit elements, different arrangements of circuit elements, and other differences relative to those of the example of sampling circuitry 300.

In some examples, output circuitry 320 may include different types or arrangements of transistors, including cross-coupled transistors or other arrangements, or other types of components for performing or supporting a comparison or evaluation of input signals (e.g., single-ended input signals, double-ended input signals, differential input signals, pseudo-differential input signals), including comparisons or evaluations of drain nodes of input transistors (e.g., n-type transistors 330-*b* and 330-*i*, p-type transistors). In some examples, output circuitry 320 may be configured with a set of two or more positive voltage sources 360 having different voltage levels, which may support receiving and comparing input signals associated with a first voltage range (e.g., a voltage range associated with communications over channels 115, a voltage range associated with input nodes 310) and providing output signals associated with a second voltage range (e.g., a voltage range associated with an output bus 325, a voltage range associated with communications or processing of output signals within a receiving device) that is different than the first voltage range, among other operations.

In some examples, tail circuitry (e.g., circuit elements coupled or connected with a conductive line between source nodes of input transistors, such as a conductive line between n-type transistors 330-*b* and 330-*i*) in accordance with examples as disclosed herein may include different types or arrangements of components. For example, tail circuitry may omit one or more of the switching circuits illustrated in the example of sampling circuitry 300, such as omitting one or more elements configurable for a dynamic coupling with a voltage source (e.g., a ground voltage source 370) based on a clock signal, CK, or may include a dynamic coupling based on a signal different than the clock signal, CK. For example, one or more of the n-type transistors 330-*c*, 330-*d*, 330-*f*, or 330-*j* may be omitted, or may be provided (e.g., at a gate node), with a signal different than the clock signal, CK. In some examples, a switching circuit 380 may be enabled by a single signal (e.g., an enable signal), such as when the switching circuit 380-*a* omits an n-type transistor 330-*d*. In some examples, such an enable signal may support an enabling, configuration, or calibration associated with other impedance (e.g., relative to the source of the n-type transistor 330-*b*, relative to the source of the n-type transistor), such as coupling a capacitor, a resistor, or other circuit element to tail circuitry for mitigating imbalances of the sampling circuitry (e.g., threshold voltage imbalances between input transistors).

Figure 4:
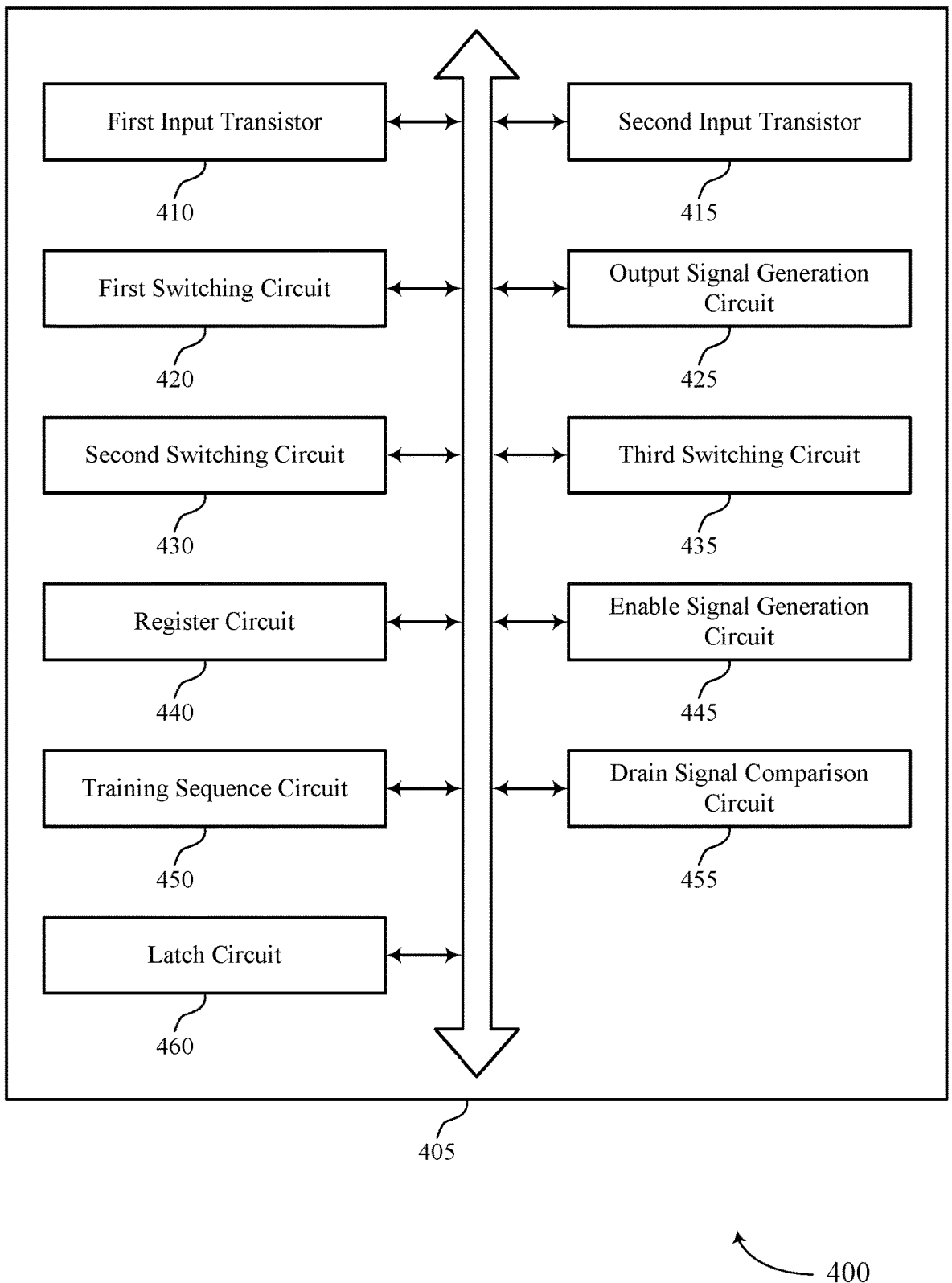
FIG. 4 shows a block diagram of sampling circuitry that supports signal sampling with offset calibration in accordance with aspects of the present disclosure.

FIG. 4 shows a block diagram 400 of sampling circuitry 405 that supports signal sampling with offset calibration in accordance with examples as disclosed herein. The sampling circuitry 405 may be an example of aspects of sampling circuitry as described with reference to FIGS. 1 through 3. The sampling circuitry 405 may include a first input transistor 410, a second input transistor 415, a first switching circuit 420, an output signal generation circuit 425, a second switching circuit 430, a third switching circuit 435, a register circuit 440, an enable signal generation circuit 445, a training sequence circuit 450, a drain signal comparison circuit 455, and a latch circuit 460. Each of these modules may communicate, directly or indirectly, with one another (e.g., via one or more buses).

The first input transistor 410 may receive (e.g., at a gate of the first input transistor 410), a first input signal. The second input transistor 415 may receive (e.g., at a gate of the second input transistor 415) a second input signal. In some examples, a source node of the second input transistor 415 may be coupled with a source node of the first input transistor 410 via a resistance (e.g., via a resistor element, via an intrinsic resistance of a conductive line between the source node of the second input transistor 415 and the source node of the first input transistor 410).

The first switching circuit 420 may be configured to couple (e.g., based on a clock signal and an enable signal) the source node of the first input transistor 410 with a ground voltage source. In some examples, for coupling the source node of the first input transistor 410 with the ground voltage source, a first transistor of the first switching circuit 420 may be enabled based on biasing a gate of the first transistor of the first switching circuit 420 with a clock signal. In some examples, for coupling the source node of the first input transistor 410 with the ground voltage source, a second transistor of the first switching circuit 420 may be enabled based on biasing a gate of the second transistor of the first switching circuit 420 with an enable signal.

The output signal generation circuit 425 may be coupled with a drain node of the first input transistor 410 and a drain node of the second input transistor 415, and may generate an output signal based on the first input signal, the second input signal, and the coupling of the source node of the first input transistor 410 with the ground voltage source via the first switching circuit 420.

In some examples, the second switching circuit 430 may be configured to couple (e.g., based on the clock signal and a second enable signal) the source node of the first input transistor 410 with the ground voltage source. In some examples, the output signal generation circuit 425 may generate the output signal based on the coupling of the source node of the first input transistor 410 with the ground voltage source via the second switching circuit 430.

In some examples, the third switching circuit 435 may be configured to couple (e.g., based on the clock signal and a third enable signal) the source node of the second input transistor 415 with the ground voltage source. In some examples, the output signal generation circuit 425 may generate the output signal based on the coupling of the source node of the second input transistor 415 with the ground voltage source via the third switching circuit 435.

In some examples, the register circuit 440 may be configured for writing a configuration setting (e.g., related to an enabling or disabling of one or more of the first switching circuit 420, the second switching circuit 430, or the third switching circuit 435). In some examples, the register circuit 440 may be configured for setting or accessing a state of a one-time programmable storage element (e.g., a fuse, an anti-fuse).

In some examples, the enable signal generation circuit 445 may generate one or more enable signals based on a configuration setting written at the register circuit 440. In some examples, the enable signal generation circuit 445 may generate an enable signal based on the training sequence circuit 450 evaluating an imbalance between the first input transistor 410 and the second input transistor 415 (e.g., associated with an imbalance or difference between threshold voltages of the first input transistor 410 and the second input transistor 415.

The training sequence circuit 450 may enable one or more switching circuits of a set of switching circuits (e.g., including one or more of the first switching circuit 420, the second switching circuit 430, or the third switching circuit 435), where each switching circuit of the set is configurable to couple the source node of the first input transistor 410 with the ground voltage source or to couple the source node of the second input transistor 415 with the ground voltage source. In some examples, the training sequence circuit 450 may evaluate an imbalance between the first input transistor 410 and the second input transistor 415 based on the enabling.

In some examples, for generating the output signal, the drain signal comparison circuit 455 may be configured to compare a voltage of the drain node of the first input transistor 410 (e.g., that is based on the first input signal) to a voltage of the drain node of the second input transistor 415 (e.g., that is based on the second input signal). In some examples, for generating the output signal, the latch circuit 460 may latch a result of the comparing (e.g., based on the clock signal, based another clock signal having a same frequency as the clock signal but with a phase shift).

Figure 5:
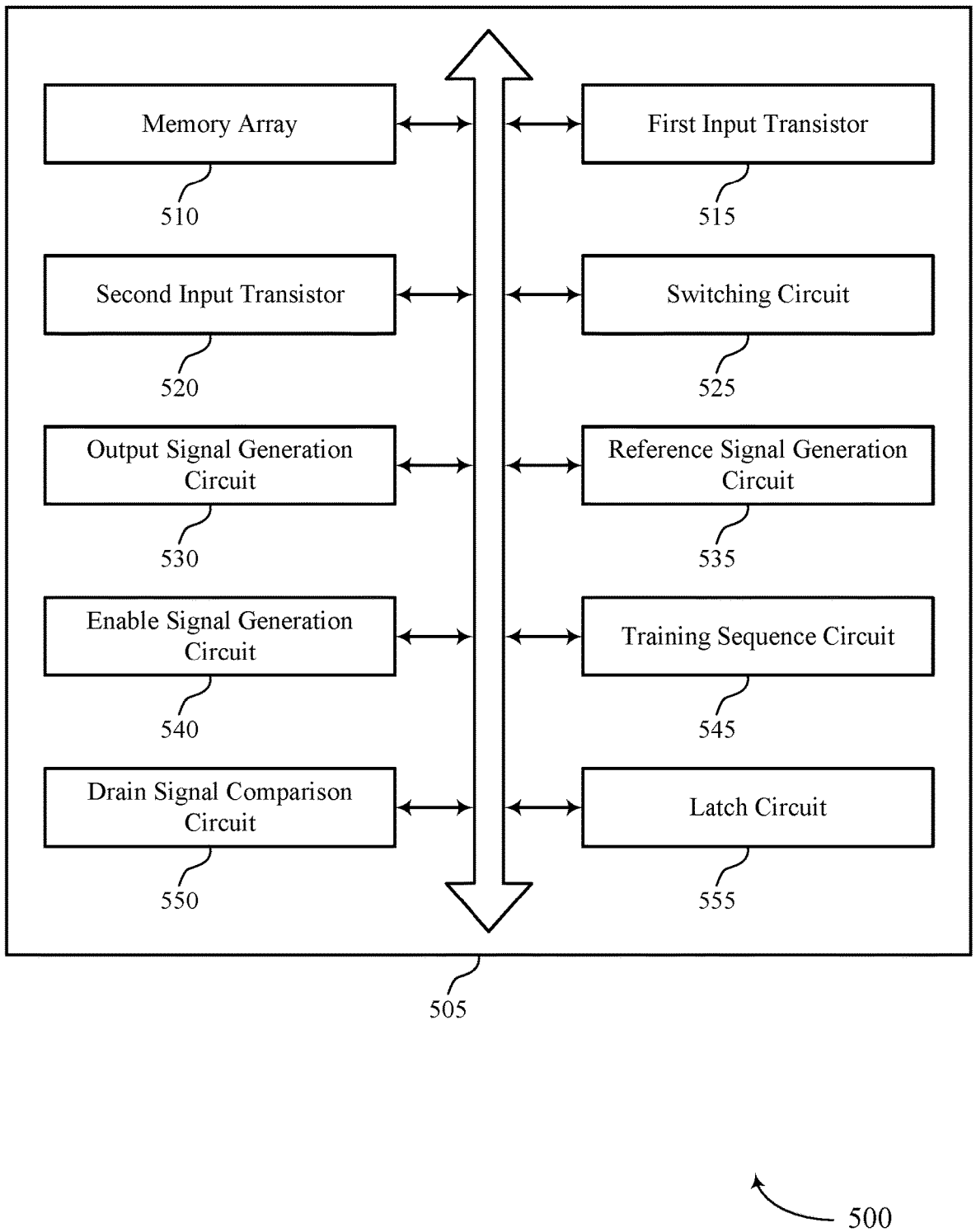
FIG. 5 shows a block diagram of a memory device that supports signal sampling with offset calibration in accordance with aspects of the present disclosure.

FIG. 5 shows a block diagram 500 of a memory device 505 that supports signal sampling with offset calibration in accordance with examples as disclosed herein. The memory device 505 may be an example of aspects of a memory device as described with reference to FIGS. 1 through 3. The memory device 505 may include a memory array 510, a first input transistor 515, a second input transistor 520, a switching circuit 525, an output signal generation circuit 530, a reference signal generation circuit 535, an enable signal generation circuit 540, a training sequence circuit 545, a drain signal comparison circuit 550, and a latch circuit 555. Each of these modules may communicate, directly or indirectly, with one another (e.g., via one or more buses). The memory device 505 may be configured for communicative coupling with a host device (e.g., a host device 105, via one or more channels 115, as described with reference to FIG. 1).

The memory array 510 may include an array of memory cells. In various examples, the memory array may include capacitive memory cells, ferroelectric memory cells, chalcogenide memory cells, thresholding memory cells, NAND memory cells, or other types or architectures of memory cells. In some examples, the memory array 510 may provide storage locations to be written to or read from by the host device.

The first input transistor 515 may receive (e.g., at a gate of the first input transistor 515) a first signal from a host device. The second input transistor 520 may receive (e.g., at a gate of the second input transistor 520), a second signal. In some examples, the second signal may be received from the host device (e.g., in a differential configuration). In some examples, the second signal may be generated at the memory device 505 (e.g., by the reference signal generation circuit 535, in a pseudo-differential configuration). In some examples, a source of the second input transistor 520 may be coupled with a source of the first input transistor 515 via a resistance (e.g., via a resistor element, via an intrinsic resistance of a conductive line between the source node of the second input transistor 520 and the source node of the first input transistor 515).

The switching circuit 525 may be configured to connect (e.g., based on a clock signal and an enable signal) the source of the first input transistor 515 or the source of the second input transistor 520 with a ground voltage source. In some examples, for the connecting, a first transistor of the switching circuit 525 may be enabled based on biasing a gate of the first transistor of the switching circuit 525 with a clock signal. In some examples, for the connecting, a second transistor of the switching circuit 525 may be enabled based on biasing a gate of the second transistor of the switching circuit 525 with an enable signal.

The output signal generation circuit 530 may be coupled with a drain of the first input transistor 515 and a drain of the second input transistor 520, and may generate a third signal based on the first signal, the second signal, and a connecting by the switching circuit 525.

In some examples, the enable signal generation circuit 540 may generate one or more enable signals based on a state of a one-time programmable storage element of the memory device 505. In some examples, the enable signal generation circuit 540 may generate the enable signal based on an evaluation by the training sequence circuit 545.

The training sequence circuit 545 may enable one or more switching circuits of a set of switching circuits of the memory device 505 (e.g., including the switching circuit 525), where each switching circuit of the set is configurable to couple the source of the first input transistor 515 with the ground voltage source or to couple the source of the second input transistor 520 with the ground voltage source. In some examples, the training sequence circuit 545 may evaluate an imbalance between the first input transistor 515 and the second input transistor 520 based on the enabling, such as an imbalance between threshold voltages of the first input transistor 515 and the second input transistor 520.

In some examples, to generate the third signal, the drain signal comparison circuit 550 may compare a voltage of the drain of the first input transistor 515 (e.g., that is based on the first signal) to a voltage of the drain of the second input transistor 520 (e.g., that is based on the second signal). In some examples, to generate the third signal, the latch circuit 555 may latch a result of the comparing (e.g., based on the clock signal, based on another clock signal having a same frequency as the clock signal but with a phase shift).

Figure 6:
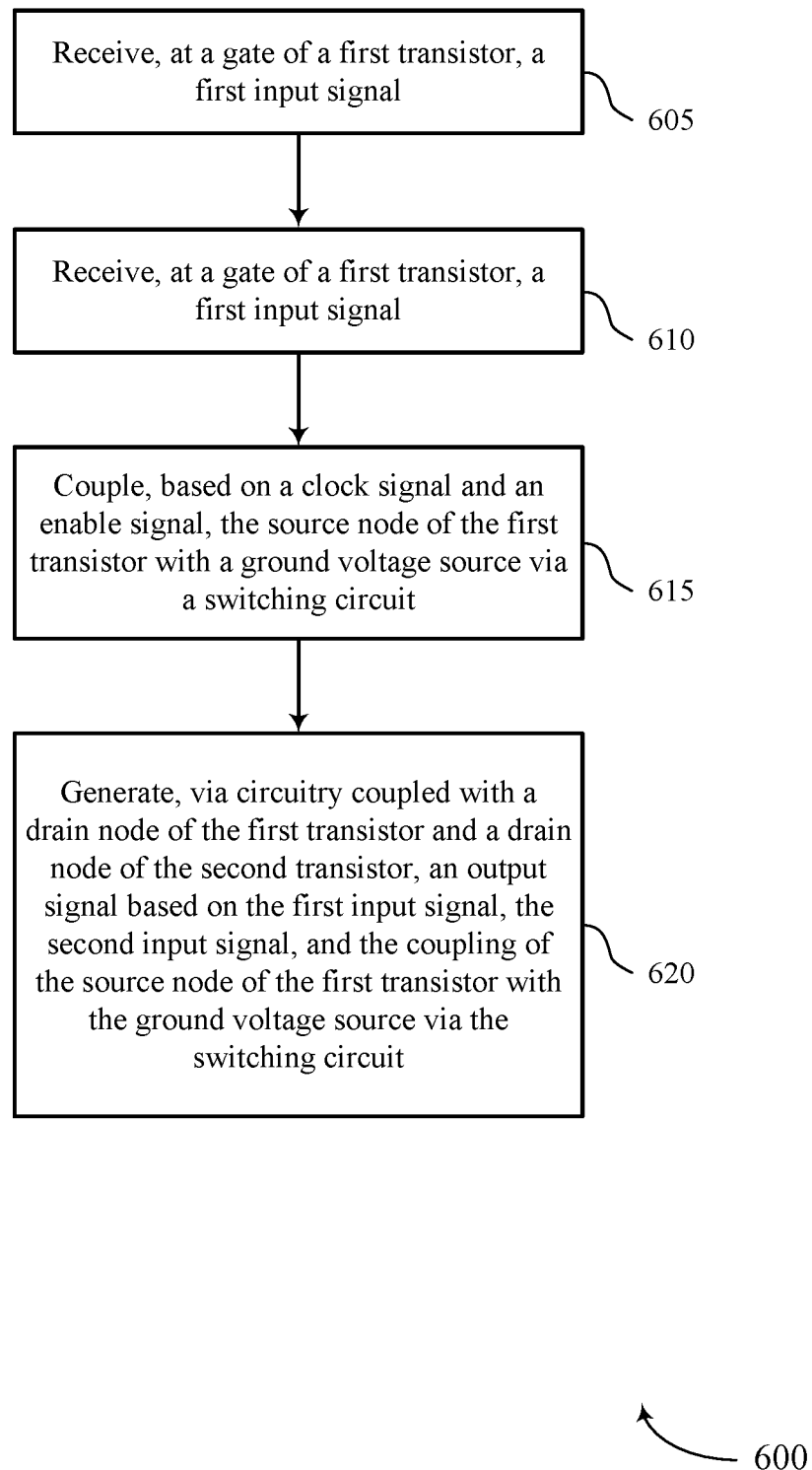
FIGS. 6 and 7 show flowcharts illustrating a method or methods that support signal sampling with offset calibration in accordance with examples as disclosed herein.

FIG. 6 shows a flowchart illustrating a method or methods 600 that supports signal sampling with offset calibration in accordance with aspects of the present disclosure. The operations of method 600 may be implemented by sampling circuitry or its components. For example, the operations of method 600 may be performed by sampling circuitry as described with reference to FIG. 4. In some examples, sampling circuitry may execute a set of instructions to control the functional elements of the sampling circuitry to perform the described functions. Additionally or alternatively, sampling circuitry may perform aspects of the described functions using special-purpose hardware.

At 605, the method 600 may include receiving, at a gate of a first transistor, a first input signal. The operations of 605 may be performed according to the methods described herein. In some examples, aspects of the operations of 605 may be performed by a first input transistor as described with reference to FIG. 4.

At 610, the method 600 may include receiving, at a gate of a second transistor, a second input signal. In some examples, a source node of the second transistor may be coupled with a source node of the first transistor via a resistor. The operations of 610 may be performed according to the methods described herein. In some examples, aspects of the operations of 610 may be performed by a second input transistor as described with reference to FIG. 4.

At 615, the method 600 may include coupling, based on a clock signal and an enable signal, the source node of the first transistor with a ground voltage source via a switching circuit. The operations of 615 may be performed according to the methods described herein. In some examples, aspects of the operations of 615 may be performed by a first switching circuit as described with reference to FIG. 4.

At 620, the method 600 may include generating, via circuitry coupled with a drain node of the first transistor and a drain node of the second transistor, an output signal based on the first input signal, the second input signal, and the coupling of the source node of the first transistor with the ground voltage source via the switching circuit. The operations of 620 may be performed according to the methods described herein. In some examples, aspects of the operations of 620 may be performed by an output signal generation circuit as described with reference to FIG. 4.

In some examples, an apparatus as described herein may perform a method or methods, such as the method 600. The apparatus may include features, means, or instructions (e.g., a non-transitory computer-readable medium storing instructions executable by a processor) for receiving, at a gate of a first transistor, a first input signal, receiving, at a gate of a second transistor, a second input signal (e.g., where a source node of the second transistor is coupled with a source node of the first transistor via a resistor), coupling, based on a clock signal and an enable signal, the source node of the first transistor with a ground voltage source via a switching circuit, and generating, via circuitry coupled with a drain node of the first transistor and a drain node of the second transistor, an output signal based on the first input signal, the second input signal, and the coupling of the source node of the first transistor with the ground voltage source via the switching circuit.

In some examples of the method 600 and the apparatus described herein, coupling the source node of the first transistor with the ground voltage source may include operations, circuitry, logic, features, means, or instructions for enabling a first transistor of the switching circuit based on biasing a gate of the first transistor of the switching circuit with the clock signal, and enabling a second transistor of the switching circuit based on biasing a gate of the second transistor of the switching circuit with the enable signal.

Some examples of the method 600 and the apparatus described herein may further include operations, circuitry, logic, features, means, or instructions for coupling, based on the clock signal and a second enable signal, the source node of the first transistor with the ground voltage source via a second switching circuit, and generating the output signal based on the coupling of the source node of the first transistor with the ground voltage source via the second switching circuit.

Some examples of the method 600 and the apparatus described herein may further include operations, circuitry, logic, features, means, or instructions for coupling, based on the clock signal and a third enable signal, the source node of the second transistor with the ground voltage source via a third switching circuit, and generating the output signal based on the coupling of the source node of the second transistor with the ground voltage source via the third switching circuit.

Some examples of the method 600 and the apparatus described herein may further include operations, circuitry, logic, features, means, or instructions for writing a configuration setting in a register circuit, and generating the enable signal based on the configuration setting written at the register circuit.

In some examples of the method 600 and the apparatus described herein, writing the configuration setting may include operations, circuitry, logic, features, means, or instructions for setting a state of a one-time programmable storage element.

Some examples of the method 600 and the apparatus described herein may further include operations, circuitry, logic, features, means, or instructions for enabling one or more switching circuits of a set of switching circuits including the switching circuit, where each switching circuit of the set may be configurable to couple the source node of the first transistor with the ground voltage source or to couple the source node of the second transistor with the ground voltage source, evaluating an imbalance between the first transistor and the second transistor based on the enabling, and generating the enable signal based on the evaluating.

In some examples of the method 600 and the apparatus described herein, generating the output signal may include operations, circuitry, logic, features, means, or instructions for comparing a voltage of the drain node of the first transistor that is based on the first input signal to a voltage of the drain node of the second transistor that is based on the second input signal, and latching a result of the comparing (e.g., based on the clock signal, based on another clock signal having a same frequency as the clock signal but with a phase shift).

Figure 7:
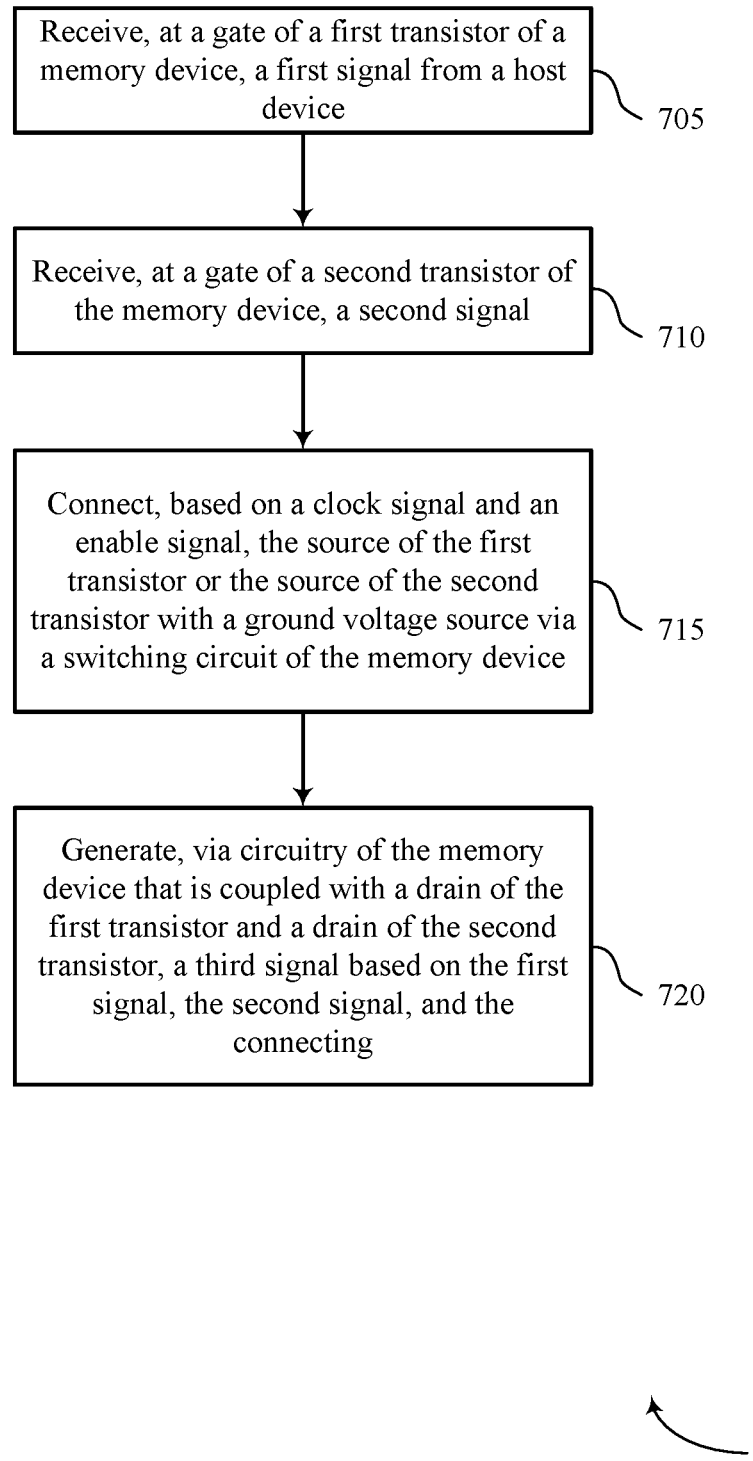

FIG. 7 shows a flowchart illustrating a method or methods 700 that supports signal sampling with offset calibration in accordance with aspects of the present disclosure. The operations of method 700 may be implemented by a memory device or its components. For example, the operations of method 700 may be performed by a memory device as described with reference to FIG. 5. In some examples, a memory device may execute a set of instructions to control the functional elements of the memory device to perform the described functions. Additionally or alternatively, a memory device may perform aspects of the described functions using special-purpose hardware.

At 705, the method 700 may include receiving, at a gate of a first transistor of a memory device, a first signal from a host device. The operations of 705 may be performed according to the methods described herein. In some examples, aspects of the operations of 705 may be performed by a first input transistor as described with reference to FIG. 5.

At 710, the method 700 may include receiving, at a gate of a second transistor of the memory device, a second signal. In some examples, a source of the second transistor may be coupled with a source of the first transistor via a resistor. The operations of 710 may be performed according to the methods described herein. In some examples, aspects of the operations of 710 may be performed by a second input transistor as described with reference to FIG. 5.

At 715, the method 700 may include connecting, based on a clock signal and an enable signal, the source of the first transistor or the source of the second transistor with a ground voltage source via a switching circuit of the memory device. The operations of 715 may be performed according to the methods described herein. In some examples, aspects of the operations of 715 may be performed by a first switching circuit as described with reference to FIG. 5.

At 720, the method 700 may include generating, via circuitry of the memory device that is coupled with a drain of the first transistor and a drain of the second transistor, a third signal based on the first signal, the second signal, and the connecting (e.g., of 715). The operations of 720 may be performed according to the methods described herein. In some examples, aspects of the operations of 720 may be performed by an output signal generation circuit as described with reference to FIG. 5.

In some examples, an apparatus as described herein may perform a method or methods, such as the method 700. The apparatus may include features, means, or instructions (e.g., a non-transitory computer-readable medium storing instructions executable by a processor) for receiving, at a gate of a first transistor of a memory device, a first signal from a host device, receiving, at a gate of a second transistor of the memory device, a second signal (e.g., where a source of the second transistor is coupled with a source of the first transistor via a resistor), connecting, based on a clock signal and an enable signal, the source of the first transistor or the source of the second transistor with a ground voltage source via a switching circuit of the memory device, and generating, via circuitry of the memory device that is coupled with a drain of the first transistor and a drain of the second transistor, a third signal based on the first signal, the second signal, and the connecting.

In some examples of the method 700 and the apparatus described herein, the connecting (e.g., of 715) may include operations, circuitry, logic, features, means, or instructions for enabling a first transistor of the switching circuit based on biasing a gate of the first transistor of the switching circuit with the clock signal, and enabling a second transistor of the switching circuit based on biasing a gate of the second transistor of the switching circuit with the enable signal.

Some examples of the method 700 and the apparatus described herein may further include operations, circuitry, logic, features, means, or instructions for generating, at the memory device, the second signal.

Some examples of the method 700 and the apparatus described herein may further include operations, circuitry, logic, features, means, or instructions for generating, at the memory device, the enable signal based on a state of a one-time programmable storage element of the memory device.

Some examples of the method 700 and the apparatus described herein may further include operations, circuitry, logic, features, means, or instructions for enabling one or more switching circuits of a set of switching circuits of the memory device including the switching circuit, where each switching circuit of the set may be configurable to couple the source of the first transistor with the ground voltage source or to couple the source of the second transistor with the ground voltage source, evaluating an imbalance between the first transistor and the second transistor based on the enabling, and generating the enable signal at the memory device based on the evaluating.

In some examples of the method 700 and the apparatus described herein, generating the third signal may include operations, circuitry, logic, features, means, or instructions for comparing a voltage of the drain of the first transistor that may be based on the first signal to a voltage of the drain of the second transistor that may be based on the second signal, and latching a result of the comparing at a latch circuit of the memory device based on the clock signal.

It should be noted that the methods described herein describe possible implementations, and that the operations and the steps may be rearranged or otherwise modified and that other implementations are possible. Further, portions from two or more of the methods may be combined.

An apparatus is described. The apparatus may include a first input node coupled with a gate of a first transistor, a second input node coupled with a gate of a second transistor, circuitry coupled with a drain node of the first transistor and a drain node of the second transistor and configured to generate an output signal based at least in part on a voltage of the first input node and a voltage of the second input node, and a resistor coupling a source node of the first transistor with a source node of the second transistor. The apparatus may also include a first switching circuit configurable to couple the source node of the first transistor with a voltage source based at least in part on a clock signal, and a second switching circuit configurable to couple the source node of the second transistor with the voltage source based at least in part on the clock signal.

Some examples of the apparatus may include a third switching circuit configurable to couple the source node of the first transistor with the voltage source based at least in part on the clock signal and an enable signal.

In some examples of the apparatus, the third switching circuit may include a third transistor and a fourth transistor in an electrically serial configuration between the source node of the first transistor and the voltage source, where the third transistor is configurable to be enabled based at least in part on the clock signal and the fourth transistor is configurable to be enabled based at least in part on the enable signal.

Some examples of the apparatus may include a fourth switching circuit configurable to couple the source node of the first transistor with the voltage source based at least in part on the clock signal and a second enable signal.

Some examples of the apparatus may include a fifth switching circuit configurable to couple the source node of the second transistor with the voltage source based at least in part on the clock signal and a third enable signal.

In some examples of the apparatus, the fifth switching circuit may include a fifth transistor and a sixth transistor in an electrically serial configuration between the source node of the second transistor and the voltage source, where the fifth transistor is configurable to be enabled based at least in part on the clock signal and the sixth transistor is configurable to be enabled based at least in part on the third enable signal.

Some examples of the apparatus may include a sixth switching circuit configurable to couple the source node of the second transistor with the voltage source based at least in part on the clock signal and a fourth enable signal.

Some examples of the apparatus may include a register configured to store a configuration setting, and circuitry configured to generate the enable signal based at least in part on the stored configuration setting.

In some examples of the apparatus, the voltage source may be a ground voltage source.

In some examples of the apparatus, the circuitry configured to generate the output signal may include circuitry configured to compare a voltage at the drain node of the first transistor to a voltage at the drain node of the second transistor.

In some examples of the apparatus, the circuitry configured to generate the output signal may include a latch circuit configured to latch the output signal based at least in part on the comparison between the voltage at the drain node of the first transistor and the voltage at the drain node of the second transistor. In some examples of the apparatus, the latch circuit may be configured to latch the output signal based at least in part on the clock signal.

Another apparatus is described. The apparatus may include a first transistor and a second transistor, where a source node of the second transistor is coupled with a source node of the first transistor via a resistor. The apparatus may also include circuitry (e.g., coupled with the first transistor and the second transistor) configured to cause the apparatus to receive, at a gate of a first transistor, a first input signal, receive, at a gate of a second transistor, a second input signal, and couple, based at least in part on a clock signal and an enable signal, the source node of the first transistor with a ground voltage source via a switching circuit. The circuitry may be configured to cause the apparatus to generate an output signal based at least in part on the first input signal, the second input signal, and the coupling of the source node of the first transistor with the ground voltage source via the switching circuit.

In some examples of the apparatus, to couple the source node of the first transistor with the ground voltage source, the circuitry may be configured to cause the apparatus to enable a first transistor of the switching circuit based at least in part on biasing a gate of the first transistor of the switching circuit with the clock signal, and enable a second transistor of the switching circuit based at least in part on biasing a gate of the second transistor of the switching circuit with the enable signal.

In some examples of the apparatus, the circuitry may be further configured to cause the apparatus to couple, based at least in part on the clock signal and a second enable signal, the source node of the first transistor with the ground voltage source via a second switching circuit, and generate the output signal based at least in part on the coupling of the source node of the first transistor with the ground voltage source via the second switching circuit.

In some examples of the apparatus, the circuitry may be further configured to cause the apparatus to couple, based at least in part on the clock signal and a third enable signal, the source node of the second transistor with the ground voltage source via a third switching circuit, and generate the output signal based at least in part on the coupling of the source node of the second transistor with the ground voltage source via the third switching circuit.

In some examples of the apparatus, the circuitry may be further configured to cause the apparatus to generate the enable signal based at least in part on a configuration setting written at a register circuit.

Another apparatus is described. The apparatus may include an array of memory cells, a first transistor, and a second transistor, where a source of the second transistor is coupled with a source of the first transistor via a resistor. The apparatus may also include circuitry configured to cause the apparatus to receive, at a gate of the first transistor, a first signal from a host device, receiving, at a gate of the second transistor, a second signal, and connect, based at least in part on a clock signal and an enable signal, the source of the first transistor or the source of the second transistor with a ground voltage source via a switching circuit. The circuitry may also be configured to cause the apparatus to generate, a third signal based at least in part on the first signal, the second signal, and the connecting.

In some examples of the apparatus, to connect the source of the first transistor or the source of the second transistor with the ground voltage source, the circuitry may be configured to cause the apparatus to enable a first transistor of the switching circuit based at least in part on biasing a gate of the first transistor of the switching circuit with the clock signal, and enable a second transistor of the switching circuit based at least in part on biasing a gate of the second transistor of the switching circuit with the enable signal.

In some examples of the apparatus, the circuitry may be further configured to cause the apparatus to generate the second signal.

In some examples of the apparatus, the circuitry may be further configured to cause the apparatus to generate the enable signal based at least in part on a state of a one-time programmable storage element of the apparatus.

Information and signals described herein may be represented using any of a variety of different technologies and techniques. For example, data, instructions, commands, information, signals, bits, symbols, and chips that may be referenced throughout the above description may be represented by voltages, currents, electromagnetic waves, magnetic fields or particles, optical fields or particles, or any combination thereof. Some drawings may illustrate signals as a single signal; however, it will be understood by a person of ordinary skill in the art that the signal may represent a bus of signals, where the bus may have a variety of bit widths.

The terms "electronic communication," "conductive contact," "connected," and "coupled" may refer to a relationship between components that supports the flow of signals between the components. Components are considered in electronic communication with (or in conductive contact with or connected with or coupled with) one another if there is any conductive path between the components that can, at any time, support the flow of signals between the components. At any given time, the conductive path between components that are in electronic communication with each other (or in conductive contact with or connected with or coupled with) may be an open circuit or a closed circuit based on the operation of the device that includes the connected components. The conductive path between connected components may be a direct conductive path between the components or the conductive path between connected components may be an indirect conductive path that may include intermediate components, such as switches, transistors, or other components. In some examples, the flow of signals between the connected components may be interrupted for a time, for example, using one or more intermediate components such as switches or transistors.

The term "coupling" refers to condition of moving from an open-circuit relationship between components in which signals are not presently capable of being communicated between the components over a conductive path to a closed-circuit relationship between components in which signals are capable of being communicated between components over the conductive path. When a component, such as a controller, couples other components together, the component initiates a change that allows signals to flow between the other components over a conductive path that previously did not permit signals to flow.

The term "isolated" refers to a relationship between components in which signals are not presently capable of flowing between the components. Components are isolated from each other if there is an open circuit between them. For example, two components separated by a switch that is positioned between the components are isolated from each other when the switch is open. When a controller isolates two components, the controller affects a change that prevents signals from flowing between the components using a conductive path that previously permitted signals to flow.

The devices discussed herein, including a memory array, may be formed on a semiconductor substrate, such as silicon, germanium, silicon-germanium alloy, gallium arsenide, gallium nitride, etc. In some examples, the substrate is a semiconductor wafer. In other examples, the substrate may be a silicon-on-insulator (SOI) substrate, such as silicon-on-glass (SOG) or silicon-on-sapphire (SOP), or epitaxial layers of semiconductor materials on another substrate. The conductivity of the substrate, or sub-regions of the substrate, may be controlled through doping using various chemical species including, but not limited to, phosphorous, boron, or arsenic. Doping may be performed during the initial formation or growth of the substrate, by ion-implantation, or by any other doping means.

A switching component or a transistor discussed herein may represent a field-effect transistor (FET) and comprise a three terminal device including a source, drain, and gate. The terminals may be connected to other electronic elements through conductive materials, e.g., metals. The source and drain may be conductive and may comprise a heavily-doped, e.g., degenerate, semiconductor region. The source and drain may be separated by a lightly-doped semiconductor region or channel. If the channel is n-type (i.e., majority carriers are electrons), then the FET may be referred to as a n-type FET. If the channel is p-type (i.e., majority carriers are holes), then the FET may be referred to as a p-type FET. The channel may be capped by an insulating gate oxide. The channel conductivity may be controlled by applying a voltage to the gate. For example, applying a positive voltage or negative voltage to an n-type FET or a p-type FET, respectively, may result in the channel becoming conductive. A transistor may be "on" or "activated" when a voltage greater than or equal to the transistor's threshold voltage is applied to the transistor gate. The transistor may be "off" or "deactivated" when a voltage less than the transistor's threshold voltage is applied to the transistor gate.

The description set forth herein, in connection with the appended drawings, describes example configurations and does not represent all the examples that may be implemented or that are within the scope of the claims. The term "exemplary" used herein means "serving as an example, instance, or illustration," and not "preferred" or "advantageous over other examples." The detailed description includes specific details to providing an understanding of the described techniques. These techniques, however, may be practiced without these specific details. In some instances, well-known structures and devices are shown in block diagram form to avoid obscuring the concepts of the described examples.

In the appended figures, similar components or features may have the same reference label. Further, various components of the same type may be distinguished by following the reference label by a dash and a second label that distinguishes among the similar components. If just the first reference label is used in the specification, the description is applicable to any one of the similar components having the same first reference label irrespective of the second reference label.

The functions described herein may be implemented in hardware, software executed by a processor, firmware, or any combination thereof. If implemented in software executed by a processor, the functions may be stored on or transmitted over as one or more instructions or code on a computer-readable medium. Other examples and implementations are within the scope of the disclosure and appended claims. For example, due to the nature of software, functions described herein can be implemented using software executed by a processor, hardware, firmware, hardwiring, or combinations of any of these. Features implementing functions may also be physically located at various positions, including being distributed such that portions of functions are implemented at different physical locations.

For example, the various illustrative blocks and modules described in connection with the disclosure herein may be implemented or performed with a general-purpose processor, a DSP, an ASIC, an FPGA or other programmable logic device, discrete gate or transistor logic, discrete hardware components, or any combination thereof designed to perform the functions described herein. A general-purpose processor may be a microprocessor, but in the alternative, the processor may be any processor, controller, microcontroller, or state machine. A processor may also be implemented as a combination of computing devices (e.g., a combination of a DSP and a microprocessor, multiple microprocessors, one or more microprocessors in conjunction with a DSP core, or any other such configuration).

As used herein, including in the claims, "or" as used in a list of items (for example, a list of items prefaced by a phrase such as "at least one of" or "one or more of") indicates an inclusive list such that, for example, a list of at least one of A, B, or C means A or B or C or AB or AC or BC or ABC (i.e., A and B and C). Also, as used herein, the phrase "based on" shall not be construed as a reference to a closed set of conditions. For example, an exemplary step that is described as "based on condition A" may be based on both a condition A and a condition B without departing from the scope of the present disclosure. In other words, as used herein, the phrase "based on" shall be construed in the same manner as the phrase "based at least in part on."

The description herein is provided to enable a person skilled in the art to make or use the disclosure. Various modifications to the disclosure will be apparent to those skilled in the art, and the generic principles defined herein may be applied to other variations without departing from the scope of the disclosure. Thus, the disclosure is not limited to the examples and designs described herein, but is to be accorded the broadest scope consistent with the principles and novel features disclosed herein.

What is claimed is:

1. An apparatus, comprising:
    a first input node coupled with a gate of a first transistor;
    a second input node coupled with a gate of a second transistor;
    circuitry coupled with a drain node of the first transistor and a drain node of the second transistor and configured to generate an output signal based at least in part on a voltage of the first input node and a voltage of the second input node;
    a resistor coupling a source node of the first transistor with a source node of the second transistor;
    a first switching circuit configurable to couple the source node of the first transistor with a voltage source based at least in part on a clock signal; and
    a second switching circuit configurable to couple the source node of the second transistor with the voltage source based at least in part on the clock signal.

2. The apparatus of claim 1, further comprising:
    a third switching circuit configurable to couple the source node of the first transistor with the voltage source based at least in part on the clock signal and an enable signal.

3. The apparatus of claim 2, wherein the third switching circuit comprises:
    a third transistor and a fourth transistor in an electrically serial configuration between the source node of the first transistor and the voltage source, wherein the third transistor is configurable to be enabled based at least in part on the clock signal and the fourth transistor is configurable to be enabled based at least in part on the enable signal.

4. The apparatus of claim 2, further comprising:
    a fourth switching circuit configurable to couple the source node of the first transistor with the voltage source based at least in part on the clock signal and a second enable signal.

5. The apparatus of claim 2, further comprising:
    a fifth switching circuit configurable to couple the source node of the second transistor with the voltage source based at least in part on the clock signal and a third enable signal.

6. The apparatus of claim 5, wherein the fifth switching circuit comprises:
    a fifth transistor and a sixth transistor in an electrically serial configuration between the source node of the second transistor and the voltage source, wherein the fifth transistor is configurable to be enabled based at least in part on the clock signal and the sixth transistor is configurable to be enabled based at least in part on the third enable signal.

7. The apparatus of claim 6, further comprising:
    a sixth switching circuit configurable to couple the source node of the second transistor with the voltage source based at least in part on the clock signal and a fourth enable signal.

8. The apparatus of claim 2, further comprising:
    a register configured to store a configuration setting; and
    circuitry configured to generate the enable signal based at least in part on the stored configuration setting.

9. The apparatus of claim 1, wherein the voltage source is a ground voltage source.

10. The apparatus of claim 1, wherein the circuitry configured to generate the output signal comprises:
    circuitry configured to compare a voltage at the drain node of the first transistor to a voltage at the drain node of the second transistor.

11. The apparatus of claim 10, wherein the circuitry configured to generate the output signal comprises:
    a latch circuit configured to latch the output signal based at least in part on the comparison between the voltage at the drain node of the first transistor and the voltage at the drain node of the second transistor.

12. The apparatus of claim 11, wherein the latch circuit is configured to latch the output signal based at least in part on the clock signal.

13. A method, comprising:
    receiving, at a gate of a first transistor, a first input signal;
    receiving, at a gate of a second transistor, a second input signal, wherein a source node of the second transistor is coupled with a source node of the first transistor via a resistor;
    coupling, based at least in part on a clock signal and an enable signal, the source node of the first transistor with a ground voltage source via a switching circuit; and
    generating, via circuitry coupled with a drain node of the first transistor and a drain node of the second transistor, an output signal based at least in part on the first input signal, the second input signal, and the coupling of the source node of the first transistor with the ground voltage source via the switching circuit.

14. The method of claim 13, wherein coupling the source node of the first transistor with the ground voltage source comprises:

enabling a first transistor of the switching circuit based at least in part on biasing a gate of the first transistor of the switching circuit with the clock signal; and enabling a second transistor of the switching circuit based at least in part on biasing a gate of the second transistor of the switching circuit with the enable signal.

15. The method of claim 13, further comprising:
coupling, based at least in part on the clock signal and a second enable signal, the source node of the first transistor with the ground voltage source via a second switching circuit; and
generating the output signal based at least in part on the coupling of the source node of the first transistor with the ground voltage source via the second switching circuit.

16. The method of claim 13, further comprising:
coupling, based at least in part on the clock signal and a third enable signal, the source node of the second transistor with the ground voltage source via a third switching circuit; and
generating the output signal based at least in part on the coupling of the source node of the second transistor with the ground voltage source via the third switching circuit.

17. The method of claim 13, further comprising:
writing a configuration setting in a register circuit; and
generating the enable signal based at least in part on the configuration setting written at the register circuit.

18. The method of claim 17, wherein writing the configuration setting comprises:
setting a state of a one-time programmable storage element.

19. The method of claim 13, further comprising:
enabling one or more switching circuits of a plurality of switching circuits including the switching circuit, wherein each switching circuit of the plurality is configurable to couple the source node of the first transistor with the ground voltage source or to couple the source node of the second transistor with the ground voltage source;
evaluating an imbalance between the first transistor and the second transistor based at least in part on the enabling; and
generating the enable signal based at least in part on the evaluating.

20. The method of claim 13, wherein generating the output signal comprises:
comparing a voltage of the drain node of the first transistor that is based at least in part on the first input signal to a voltage of the drain node of the second transistor that is based at least in part on the second input signal; and
latching a result of the comparing based at least in part on the clock signal.

21. A method, comprising:
receiving, at a gate of a first transistor of a memory device, a first signal from a host device;
receiving, at a gate of a second transistor of the memory device, a second signal, wherein a source of the second transistor is coupled with a source of the first transistor via a resistor;
connecting, based at least in part on a clock signal and an enable signal, the source of the first transistor or the source of the second transistor with a ground voltage source via a switching circuit of the memory device; and generating, via circuitry of the memory device that is coupled with a drain of the first transistor and a drain of the second transistor, a third signal based at least in part on the first signal, the second signal, and the connecting.

22. The method of claim 21, wherein the connecting comprises:
enabling a first transistor of the switching circuit based at least in part on biasing a gate of the first transistor of the switching circuit with the clock signal; and
enabling a second transistor of the switching circuit based at least in part on biasing a gate of the second transistor of the switching circuit with the enable signal.

23. The method of claim 21, further comprising:
generating, at the memory device, the second signal.

24. The method of claim 21, further comprising:
generating, at the memory device, the enable signal based at least in part on a state of a one-time programmable storage element of the memory device.

25. The method of claim 21, further comprising:
enabling one or more switching circuits of a plurality of switching circuits of the memory device including the switching circuit, wherein each switching circuit of the plurality is configurable to couple the source of the first transistor with the ground voltage source or to couple the source of the second transistor with the ground voltage source;
evaluating an imbalance between the first transistor and the second transistor based at least in part on the enabling; and
generating the enable signal at the memory device based at least in part on the evaluating.

26. The method of claim 21, wherein generating the third signal comprises:
comparing a voltage of the drain of the first transistor that is based at least in part on the first signal to a voltage of the drain of the second transistor that is based at least in part on the second signal; and
latching a result of the comparing at a latch circuit of the memory device based at least in part on the clock signal.

27. An apparatus, comprising:
a first transistor;
a second transistor wherein a source node of the second transistor is coupled with a source node of the first transistor via a resistor; and
circuitry configured to cause the apparatus to:
receive, at a gate of a first transistor, a first input signal;
receive, at a gate of a second transistor, a second input signal;
couple, based at least in part on a clock signal and an enable signal, the source node of the first transistor with a ground voltage source via a switching circuit; and
generate an output signal based at least in part on the first input signal, the second input signal, and the coupling of the source node of the first transistor with the ground voltage source via the switching circuit.

28. The apparatus of claim 27, wherein, to couple the source node of the first transistor with the ground voltage source, the circuitry is configured to cause the apparatus to:
enable a first transistor of the switching circuit based at least in part on biasing a gate of the first transistor of the switching circuit with the clock signal; and enable a second transistor of the switching circuit based at least in part on biasing a gate of the second transistor of the switching circuit with the enable signal.

29. The apparatus of claim 27, wherein the circuitry is further configured to cause the apparatus to:
couple, based at least in part on the clock signal and a second enable signal, the source node of the first transistor with the ground voltage source via a second switching circuit; and
generate the output signal based at least in part on the coupling of the source node of the first transistor with the ground voltage source via the second switching circuit.

30. The apparatus of claim 27, wherein the circuitry is further configured to cause the apparatus to:
couple, based at least in part on the clock signal and a third enable signal, the source node of the second transistor with the ground voltage source via a third switching circuit; and
generate the output signal based at least in part on the coupling of the source node of the second transistor with the ground voltage source via the third switching circuit.

31. The apparatus of claim 27, wherein the circuitry is further configured to cause the apparatus to:
generate the enable signal based at least in part on a configuration setting written at a register circuit.

32. An apparatus, comprising:
an array of memory cells;
a first transistor;
a second transistor, wherein a source of the second transistor is coupled with a source of the first transistor via a resistor; and
circuitry configured to cause the apparatus to:
receive, at a gate of the first transistor, a first signal from a host device;
receive, at a gate of the second transistor, a second signal;
connect, based at least in part on a clock signal and an enable signal, the source of the first transistor or the source of the second transistor with a ground voltage source via a switching circuit; and
generate, a third signal based at least in part on the first signal, the second signal, and the connecting.

33. The apparatus of claim 32, wherein, to connect the source of the first transistor or the source of the second transistor with the ground voltage source, the circuitry is configured to cause the apparatus to:
enable a first transistor of the switching circuit based at least in part on biasing a gate of the first transistor of the switching circuit with the clock signal; and
enable a second transistor of the switching circuit based at least in part on biasing a gate of the second transistor of the switching circuit with the enable signal.

34. The apparatus of claim 32, wherein the circuitry is further configured to cause the apparatus to:
generate the second signal.

35. The apparatus of claim 32, wherein the circuitry is further configured to cause the apparatus to:
generate the enable signal based at least in part on a state of a one-time programmable storage element of the apparatus.

* * * * *